United States Patent
Lung

(10) Patent No.: US 11,211,395 B2
(45) Date of Patent: Dec. 28, 2021

(54) 3D MEMORY ARRAY HAVING SELECT LINES

(71) Applicant: MACRONIX INTERNATIONAL CO., LTD., Hsinchu (TW)

(72) Inventor: Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/556,912

(22) Filed: Aug. 30, 2019

(65) Prior Publication Data

US 2021/0066314 A1   Mar. 4, 2021

(51) Int. Cl.
| | |
|---|---|
| G11C 16/10 | (2006.01) |
| H01L 27/1157 | (2017.01) |
| G11C 16/04 | (2006.01) |
| G11C 16/14 | (2006.01) |
| H01L 27/11582 | (2017.01) |
| G06F 7/544 | (2006.01) |

(Continued)

(52) U.S. Cl.
CPC ........ *H01L 27/1157* (2013.01); *G06F 7/5443* (2013.01); *G11C 16/0466* (2013.01); *G11C 16/10* (2013.01); *G11C 16/14* (2013.01); *H01L 21/3215* (2013.01); *H01L 21/32133* (2013.01); *H01L 21/76877* (2013.01); *H01L 23/5226* (2013.01); *H01L 27/11582* (2013.01); *H01L 29/40117* (2019.08)

(58) Field of Classification Search
CPC .......................... G11C 16/10; H01L 29/1157
USPC .................................................... 365/185.29
See application file for complete search history.

(56) References Cited

U.S. PATENT DOCUMENTS

| 8,437,192 B2 | 5/2013 | Lung et al. |
|---|---|---|
| 9,362,302 B1 | 6/2016 | Lai |

(Continued)

FOREIGN PATENT DOCUMENTS

| TW | 201628194 A | 8/2016 |
|---|---|---|
| TW | 201635295 A | 10/2016 |
| TW | 2019315 A | 8/2019 |

OTHER PUBLICATIONS

Lue et al., "A Novel 3D AND-type NVM Architecture Capable of High-density, Low-power In-Memory Sum-of-Product Computation for Artificial Intelligence Application," IEEE Symp. on VLSI Technology, Jun. 18-22, 2018, 2 pages.*

(Continued)

*Primary Examiner* — Muna A Techane
(74) *Attorney, Agent, or Firm* — Andrew L. Dunlap; Haynes Beffel & Wolfeld

(57) ABSTRACT

A device comprises a column of cells disposed in multiple levels of word lines including a pillar comprising a first vertical conductive line, a second vertical conductive line, and a vertical semiconductor body disposed between and in contact with the first and second vertical conductive lines. A pillar select line is adjacent to and separated by a gate dielectric from the vertical semiconductor body to form a pillar select switch, the pillar select line disposed beneath the first and second vertical conductive lines. A bottom select line is disposed beneath the first and second vertical conductive lines and insulated from the pillar select line and the first and second vertical conductive lines. The bottom select line is in current-flow contact with the vertical semiconductor body of the pillar.

7 Claims, 26 Drawing Sheets

(51) Int. Cl.
*H01L 21/3213* (2006.01)
*H01L 21/3215* (2006.01)
*H01L 21/768* (2006.01)
*H01L 21/28* (2006.01)
*H01L 23/522* (2006.01)

(56) References Cited

U.S. PATENT DOCUMENTS

| | | |
|---|---|---|
| 9,508,430 B2 | 11/2016 | Murooka |
| 2011/0241077 A1 | 10/2011 | Lung |
| 2011/0286283 A1* | 11/2011 | Lung ................... H01L 29/7926 365/185.28 |
| 2013/0094273 A1 | 4/2013 | Chien et al. |
| 2015/0340371 A1* | 11/2015 | Lue ................... H01L 27/11582 257/324 |
| 2016/0111517 A1* | 4/2016 | Wu .......................... H01L 45/16 438/154 |
| 2016/0141337 A1 | 5/2016 | Shimabukuro et al. |
| 2019/0148393 A1 | 5/2019 | Lue |
| 2019/0326313 A1* | 10/2019 | Cui ................... H01L 29/40117 |
| 2020/0026990 A1* | 1/2020 | Lue ................... H01L 27/11565 |
| 2020/0203363 A1* | 6/2020 | Lue ................... H01L 21/31111 |

OTHER PUBLICATIONS

TW Office Action in Application No. 108141819 dated Jul. 10, 2020 (with Google Translation), 17 pages.

\* cited by examiner

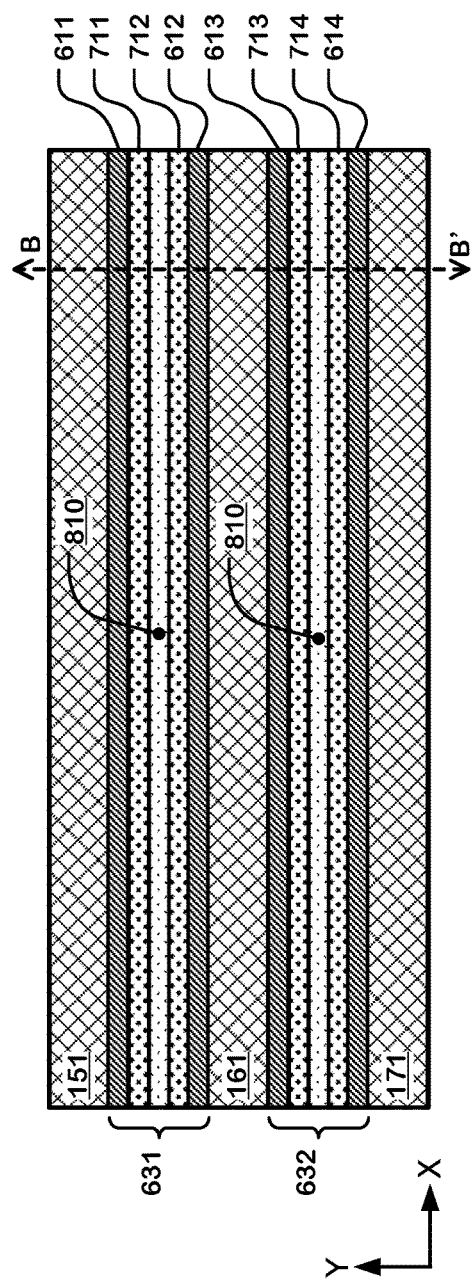
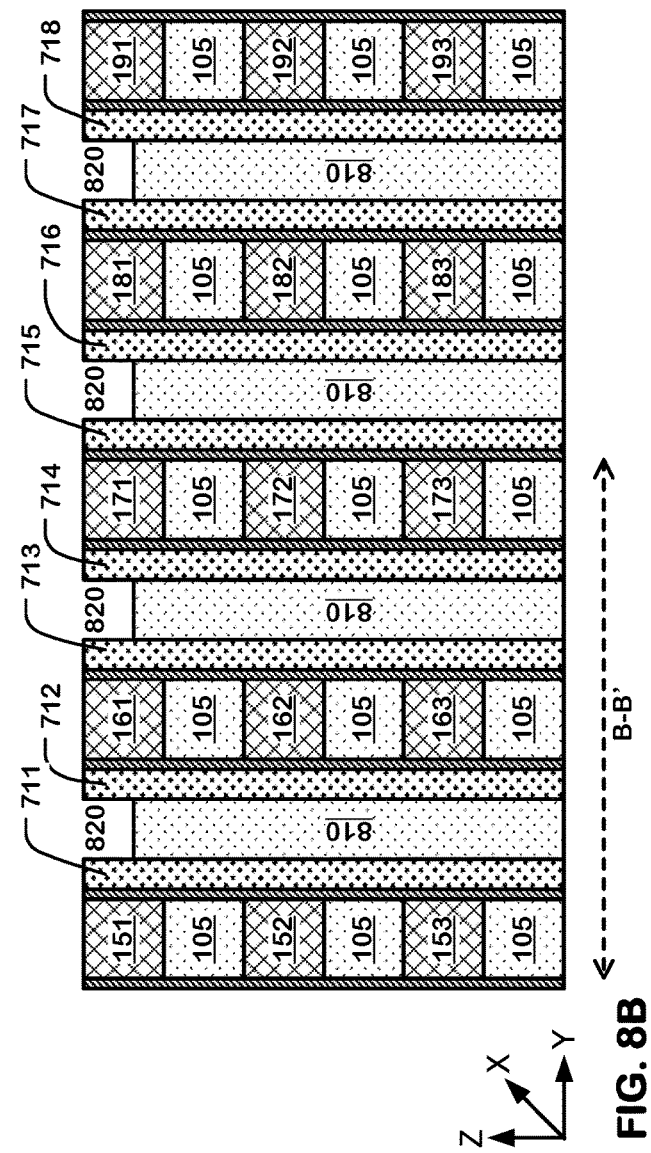
FIG. 8A
FIG. 8B

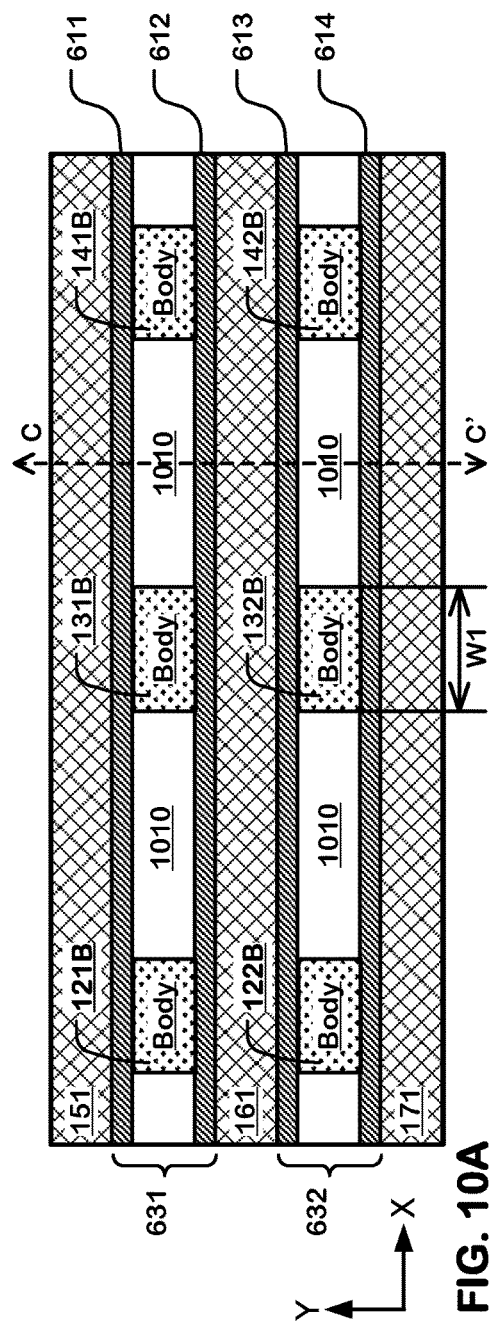
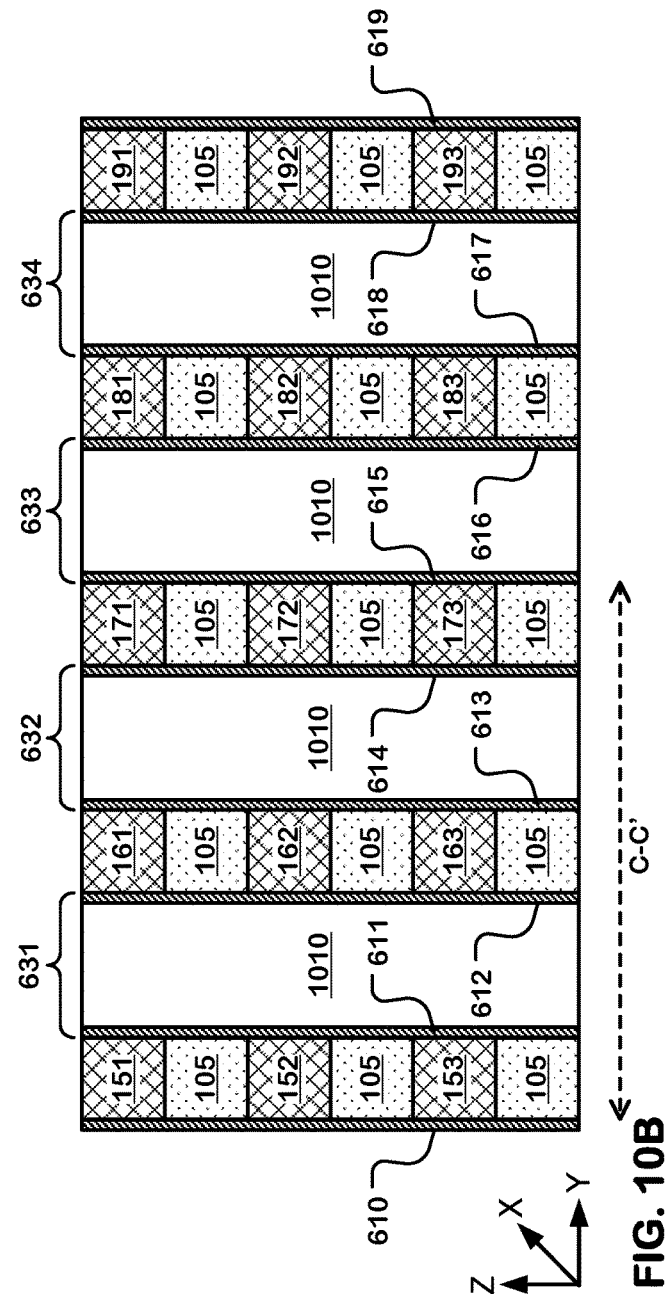

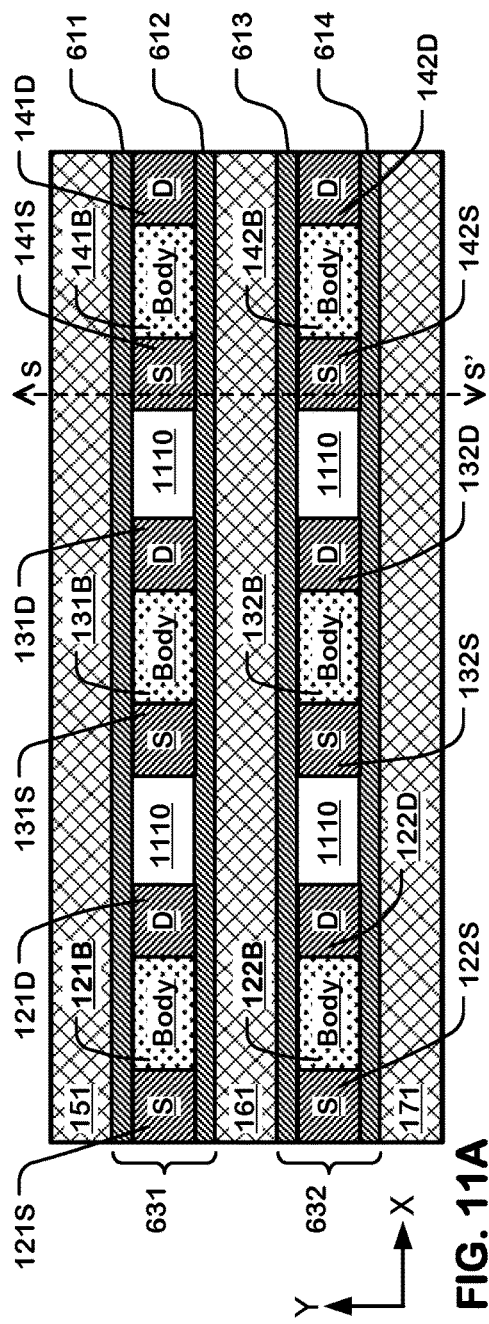
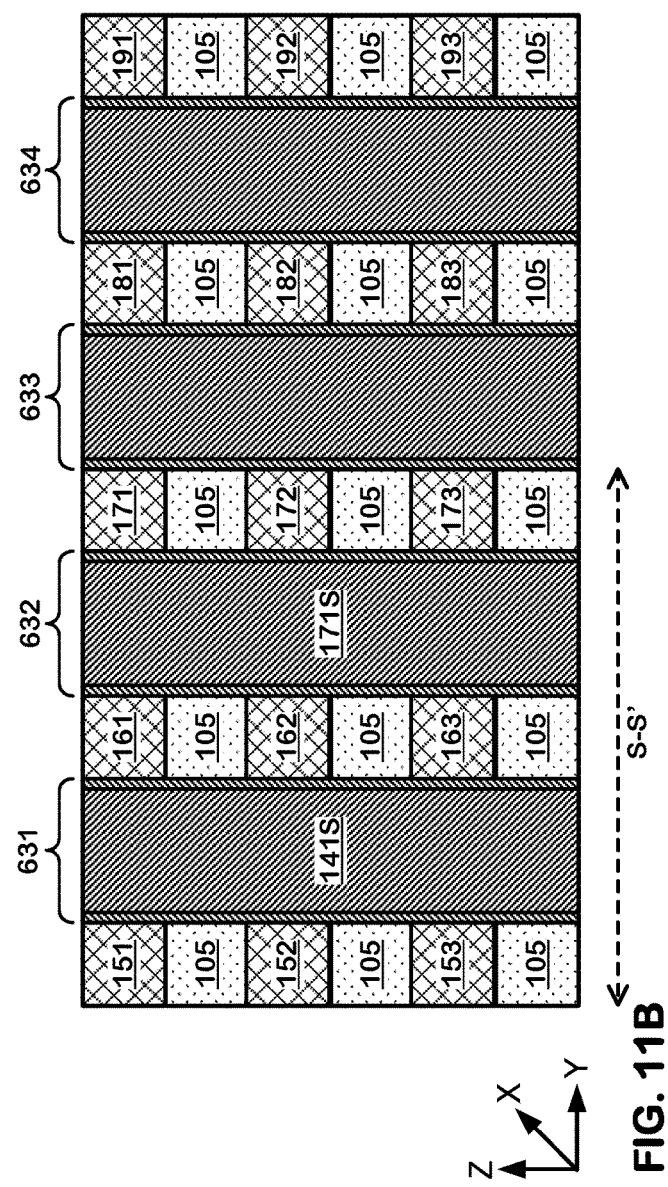
FIG. 11A
FIG. 11B

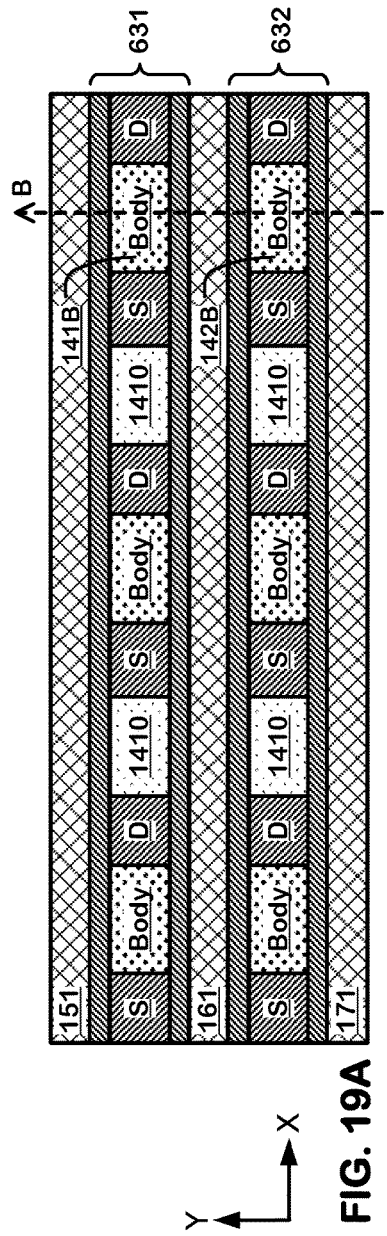
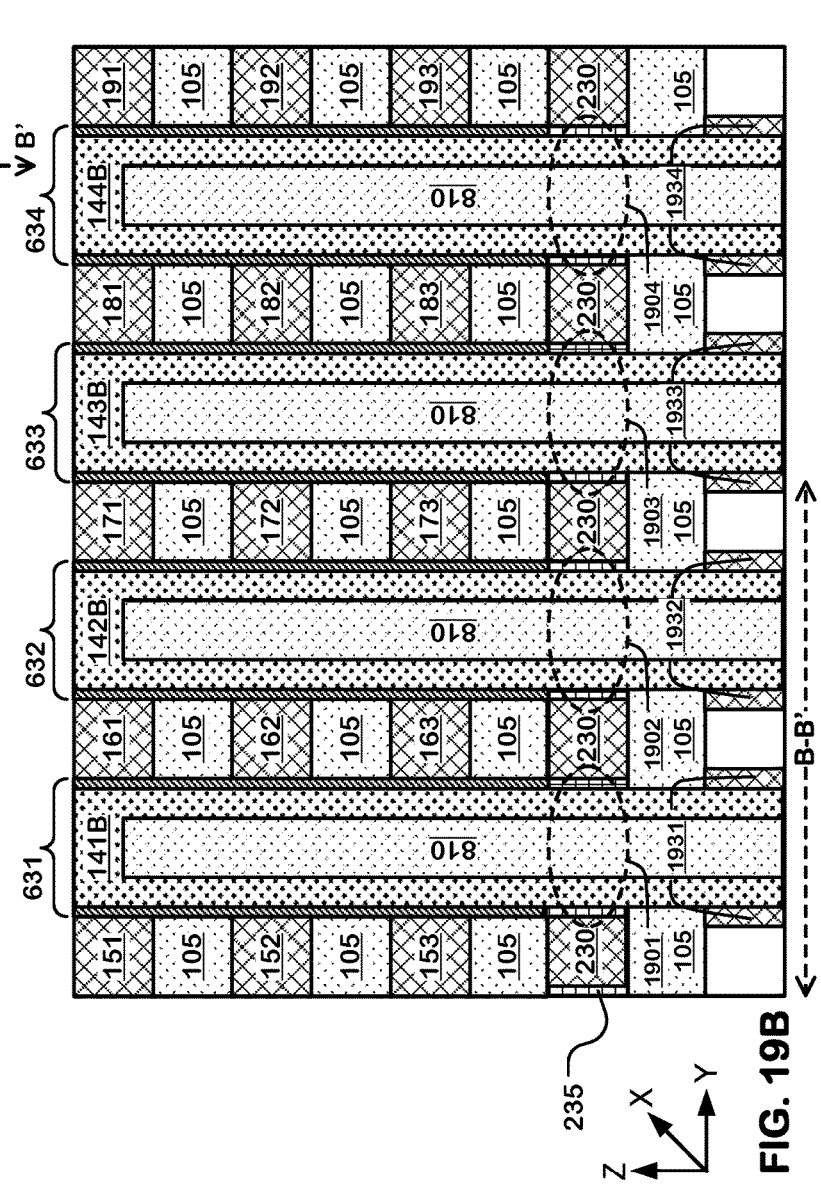
FIG. 19A
FIG. 19B

3D MEMORY ARRAY HAVING SELECT LINES

BACKGROUND

Field

The present invention relates to circuitry that can be used to perform sum-of-products operations.

Description of Related Art

In neuromorphic computing systems, machine learning systems and circuitry used for some types of computation based on linear algebra, the sum-of-products function can be an important component.

The sum-of-products function can be realized as a circuit operation or an "in-memory" operation using cross-point array architectures in which the electrical characteristics of cells of the array effectuate the function.

For high-speed implementations, it is desirable to have a very large array so that many operations can be executed in parallel, or very large sum-of-products series can be performed.

It is desirable to provide structures for sum-of-products operations suitable for implementation in large arrays.

SUMMARY

A device is described that comprises a 3D array of cells arranged for execution of a sum-of-products operation. In technology described herein, a device comprises a column of memory cells disposed in multiple levels of word lines. The column of cells is formed using a pillar including a first vertical conductive line, a second vertical conductive line, and a vertical semiconductor body disposed between and in contact with the first and second vertical conductive lines. Memory cells are formed at cross-points of the word lines with the pillar, having source and drain terminals in the first and second vertical conductive lines, and channels in the vertical semiconductor body. A pillar select line is adjacent to and separated by a gate dielectric from the vertical semiconductor body to form a pillar select switch, the pillar select line disposed beneath the first and second vertical conductive lines. A bottom select line is disposed beneath the first and second vertical conductive lines and insulated from the pillar select line and the first and second vertical conductive lines. The bottom select line is in current-flow contact with the vertical semiconductor body of the pillar. The bottom select line can extend in a first direction, and the pillar select line can extend in a second direction orthogonal to the first direction. In this configuration, the pillar select switch can be used to connect the vertical semiconductor body to the bottom select line and to disconnect the vertical semiconductor body to the bottom select line for the purposes of applying bias voltages or currents to the vertical semiconductor body that are different from the voltages or currents applied to the first and second vertical conductive lines.

The device can comprise a stack of conductive strips disposed adjacent the vertical semiconductor body above the pillar select line, and charge storage structures disposed on sidewalls of conductive strips in the stack of conductive strips.

The device can comprise a first horizontal conductive line overlying the column and coupled to the first vertical conductive line of the pillar, and a second horizontal conductive line overlying the column and coupled to the second vertical conductive line of the pillar, wherein the first horizontal conductive line can extend in a first direction, and the second horizontal conductive line can extend in a second direction orthogonal to the first direction. In one embodiment, the first and second horizontal conductive lines can be input lines and output lines, respectively. In another embodiment, the first and second horizontal conductive lines can be output lines and input lines, respectively.

The device can comprise a bias circuit operatively coupled to the bottom select line to apply bias voltages to the vertical semiconductor body for at least one of program and erase operations for the column of cells.

A device can comprise a large array of columns of memory cells disposed in multiple levels of word lines, each of the columns including a pillar comprising a first vertical conductive line, a second vertical conductive line, and a vertical semiconductor body disposed between and in contact with the first and second vertical conductive lines. The device comprises a plurality of pillar select lines disposed beneath the first and second vertical conductive lines in the columns of cells, each of the pillar select lines adjacent to and separated by a gate dielectric from a row of vertical semiconductor bodies to form a row of pillar select switches. The device comprises a plurality of bottom select lines disposed beneath the first and second vertical conductive lines and insulated from the pillar select lines and the first and second vertical conductive lines in the columns of cells, each of the bottom select lines in current-flow contact with a column of vertical semiconductor bodies.

The device comprises a plurality of stacks of conductive strips disposed adjacent vertical semiconductor bodies in the columns above the pillar select line, and charge storage structures disposed on sidewalls of conductive strips in the stacks of conductive strips.

The stacks of conductive strips in some embodiments are separated by trenches. The pillar select lines can be coupled to the vertical semiconductor bodies in respective rows of pillars arranged across multiple trenches. The bottom select lines can be coupled to the vertical semiconductor bodies of pillars arranged along respective trenches. The bottom select lines can extend in a first direction, and the pillar select lines can extend in a second direction orthogonal to the first direction.

The device can comprise first horizontal conductive lines overlying the stacks and coupled to the first vertical conductive lines of pillars arranged along respective trenches, and second horizontal conductive lines overlying the stacks and coupled to the second vertical conductive lines in respective rows of pillars arranged across multiple trenches, wherein the first horizontal conductive lines can extend in a first direction, and the second horizontal conductive lines can extend in a second direction orthogonal to the first direction.

A method is also provided for manufacturing a memory device as described herein.

Other aspects and advantages of the present invention can be seen on review of the drawings, the detailed description and the claims, which follow.

BRIEF DESCRIPTION OF THE DRAWINGS

FIGS. 5, 6A-14A and 6B-14B illustrate an example process flow for manufacturing an array of columns of cells in multiple levels of word lines, each of the columns including a pillar comprising a first vertical conductive line, a second vertical conductive line, and a vertical semiconductor body disposed between and in contact with the first and second vertical conductive lines.

FIGS. 19A and 19B illustrate results from forming pillar select lines and bottom select lines.

DETAILED DESCRIPTION

Figure 1:
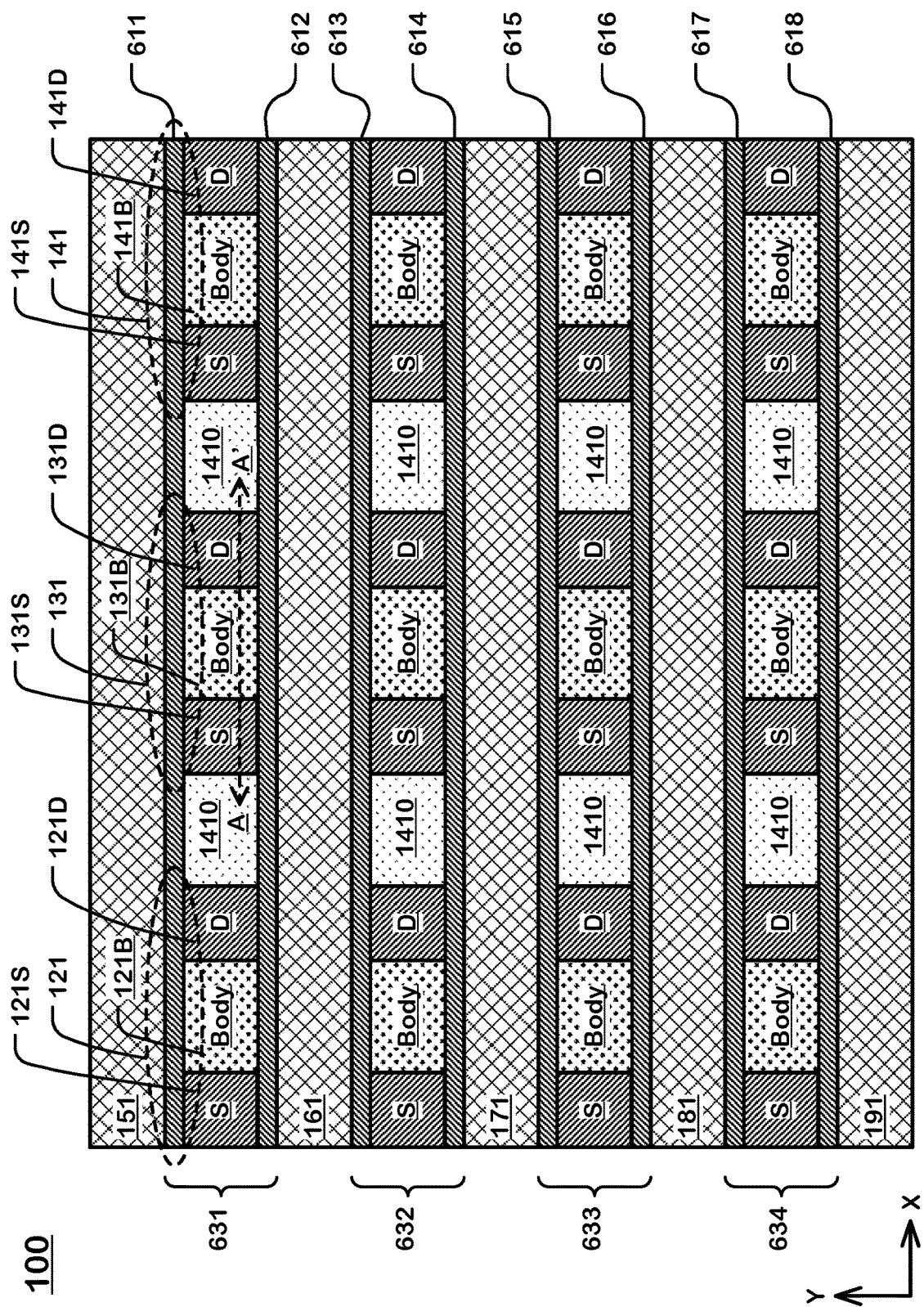
FIG. 1 illustrates a layout view of an example 3D device comprising a 3D array of cells.

A detailed description of embodiments of the present invention is provided with reference to the Figures. It is to be understood that there is no intention to limit the technology to the specifically disclosed structural embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 illustrates a layout view of an example 3D device comprising a 3D array of cells 100. FIG. 1 illustrates cells (121, 131, 141) at an upper level of columns of memory cells. Each of the columns can include a pillar comprising a first vertical conductive line (121S, 131S, 141S), a second vertical conductive line (121D, 131D, 141D), and a vertical semiconductor body (121B, 131B, 141B) disposed between and in contact with the first and second vertical conductive lines. Adjacent columns are insulated from each other by insulating material 1410. The vertical semiconductor body (121B, 131B, 141B) can comprise semiconductor materials adapted to act as channels for the memory cells, such materials as Si, Ge, SiGe, GaAs, and SiC. The first and second vertical conductive lines can be disposed on sidewalls of the vertical semiconductor body.

A plurality of stacks of conductive strips (151, 161, 171, 181, 191) is disposed adjacent vertical semiconductor bodies (121B, 131B, 141B) in the columns. Charge storage structures (611-618) are disposed on sidewalls of conductive strips in the stacks of conductive strips. The columns of cells are disposed at cross-points of the conductive strips in the stacks and the pillars. The conductive strips in the stacks can include word lines for the cells in the columns. Conductive strips in the stacks are separated by trenches (631-634). The columns of cells are disposed in the trenches. The conductive strips can comprise a variety of materials including polysilicon, doped semiconductors, metals, and conductive compounds, including materials comprising Si, Ge, SiGe, SiC, TiN, TaN, W, and Pt.

The charge storage structures (611-618) can include for example flash memory technologies known as ONO (oxide-nitride-oxide), ONONO (oxide-nitride-oxide-nitride-oxide), SONOS (silicon-oxide-nitride-oxide-silicon), BE-SONOS (bandgap engineered silicon-oxide-nitride-oxide-silicon), TANOS (tantalum nitride, aluminum oxide, silicon nitride, silicon oxide, silicon), and MA BE-SONOS (metal-high-k bandgap-engineered silicon-oxide-nitride-oxide-silicon).

Figure 2:
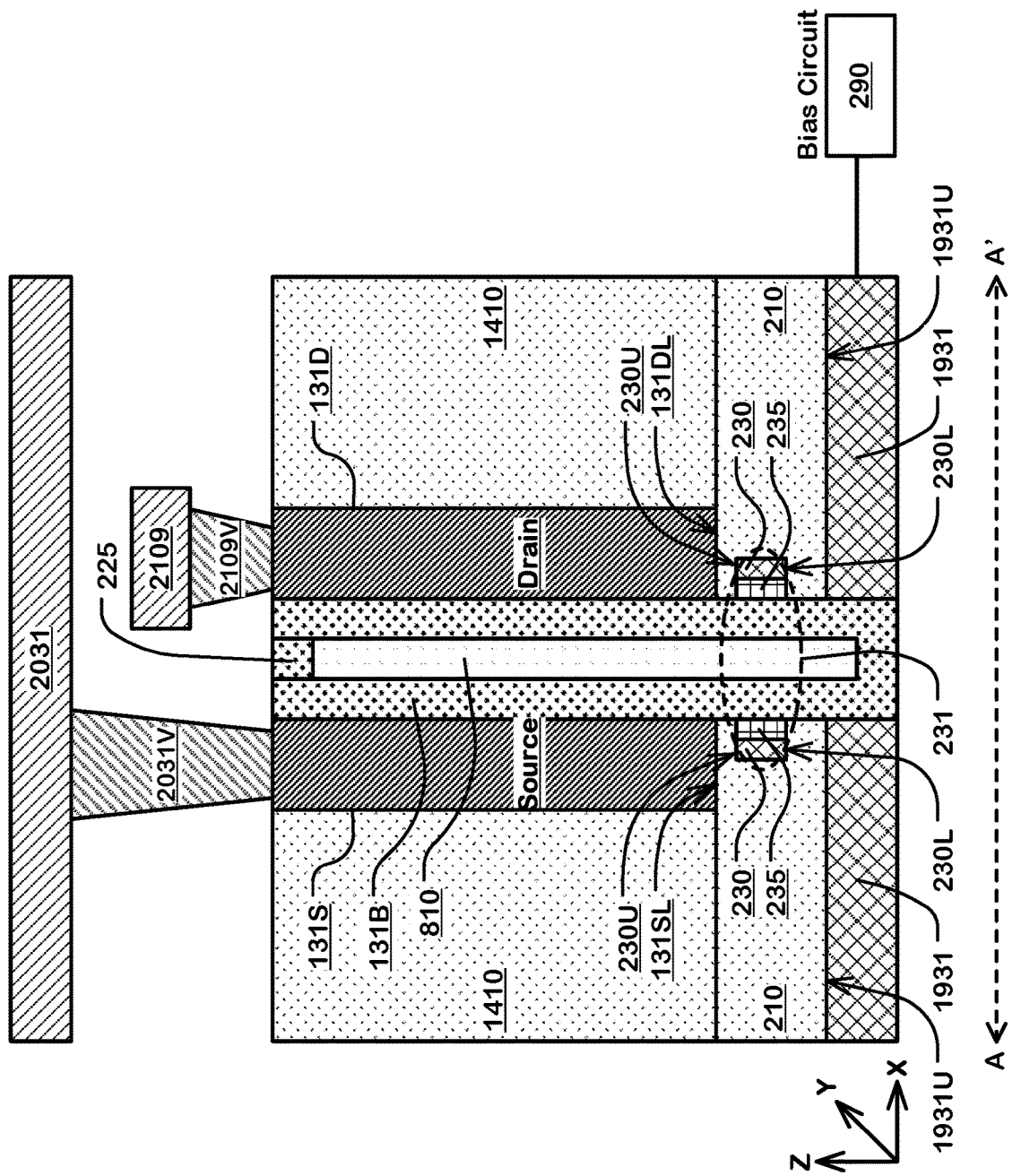
FIG. 2 illustrates a vertical cross-section of a column of cells.

FIG. 2 illustrates a vertical cross-section of a column of cells taken along a line A-A' as shown in FIG. 1. As shown in this example, a column of cells (131-133, FIG. 3) in multiple levels of word lines includes a pillar comprising a first vertical conductive line (131S), a second vertical conductive line (131D), and a vertical semiconductor body (131B) disposed between and in contact with the first and second vertical conductive lines. Cells in the column are formed at cross-points of the word lines with the pillar, having source and drain terminals in the first and second vertical conductive lines, and channels in the vertical semiconductor body. The vertical semiconductor body can include a first vertical portion on a sidewall of the first vertical conductive line (131S), a second vertical portion on a sidewall of the second vertical conductive line (131D), and a bottom portion connecting the first and second vertical portions. Insulating material 810 can be disposed between the first and second vertical portions and above the bottom portion. A plug (225) can be disposed at an upper end of the vertical semiconductor body (131B) above the insulating material 810. The plug (225) can include polysilicon.

A pillar select line (230) is disposed adjacent to and separated by a gate dielectric (235) from the vertical semiconductor body (131B) to form a pillar select switch (231). The pillar select line (230) is disposed beneath the first and second vertical conductive lines (131S, 131D), and insulated from the first and second vertical conductive lines (131S, 131D) by an interlayer dielectric 210. The pillar select line (230) has an upper surface 230U below lower ends (131SL, 131DL) of the first and second vertical conductors (131S, 131D), and a lower surface 230L. The pillar select switch (231) can control current-flow through the vertical semiconductor body (131B).

A bottom select line (1931) is in current-flow contact with the vertical semiconductor body 131B disposed beneath the first and second vertical conductive lines (131S, 131D) and insulated from the pillar select line 230 and the first and second vertical conductive lines 131S and 131D. In one embodiment, a bottom select line 1931 is disposed beneath the pillar select line 230. The bottom select line (1931) has an upper surface (1931U) spaced away from the lower surface 230L of the pillar select line (230) by an interlayer dielectric 210.

The bottom select line (1931) can extend in a first direction (X-direction), and the pillar select line (230) can extend in a second direction (Y-direction) orthogonal to the first direction.

The device can include a first horizontal conductive line (2031) overlying the column and coupled to the first vertical conductive line (131S) via a first interlayer connector 2031V, and a second horizontal conductive line (2109)

overlying the column and coupled to the second vertical conductive line (131D) via a second interlayer connector 2109V. The first horizontal conductive line (2031) can extend in a first direction (X-direction), and the second horizontal conductive line (2109) can extend in a second direction (Y-direction) orthogonal to the first direction.

In one embodiment, the first and second horizontal conductive lines can be input lines and output lines, respectively. In an alternative embodiment, the first and second horizontal conductive lines are output lines and input lines, respectively.

A bias circuit (290) can be operatively coupled to the bottom select line (1931) to apply bias voltages to the vertical semiconductor body (131B) for at least one of program and erase operations for the column of cells.

Figure 3:
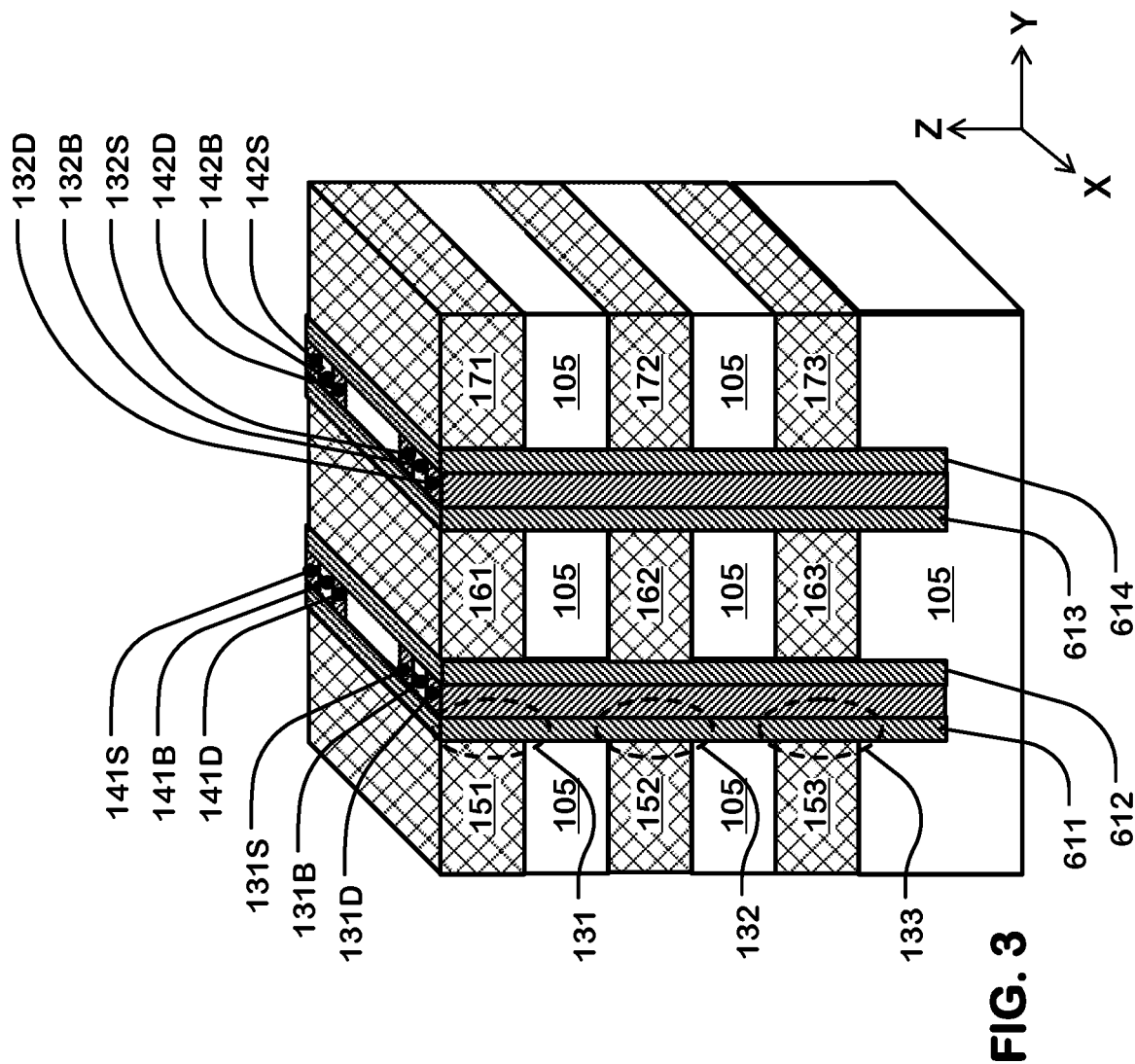
FIG. 3 is a perspective view of a 3D device comprising an array of columns of cells disposed at cross-points of the conductive strips in the stacks and the pillars.

FIG. 3 is a perspective view of a 3D device comprising an array of columns of memory cells disposed at cross-points of the conductive strips in the stacks and the pillars. The conductive strips in the stacks can include word lines for the cells in the columns. The device includes a plurality of stacks of conductive strips (151-153, 161-163, 171-173) disposed adjacent vertical semiconductor bodies (131B, 141B, 132B, 142B) in the columns, the conductive strips including the word lines. Conductive strips in the stacks are separated by insulating material 105. The vertical semiconductor bodies (131B, 141B, 132B, 142B) are disposed between and in contact with the first and second vertical conductive lines (131S and 131D; 141S and 141D; 132S and 132D; 142S and 142D) in respective columns. Charge storage structures (611-614) are disposed on sidewalls of conductive strips in the stacks of conductive strips, wherein the columns of cells (131, 132, 133) are disposed at crosspoints of the conductive strips (151-153) in the stacks and the pillars.

Figure 4:
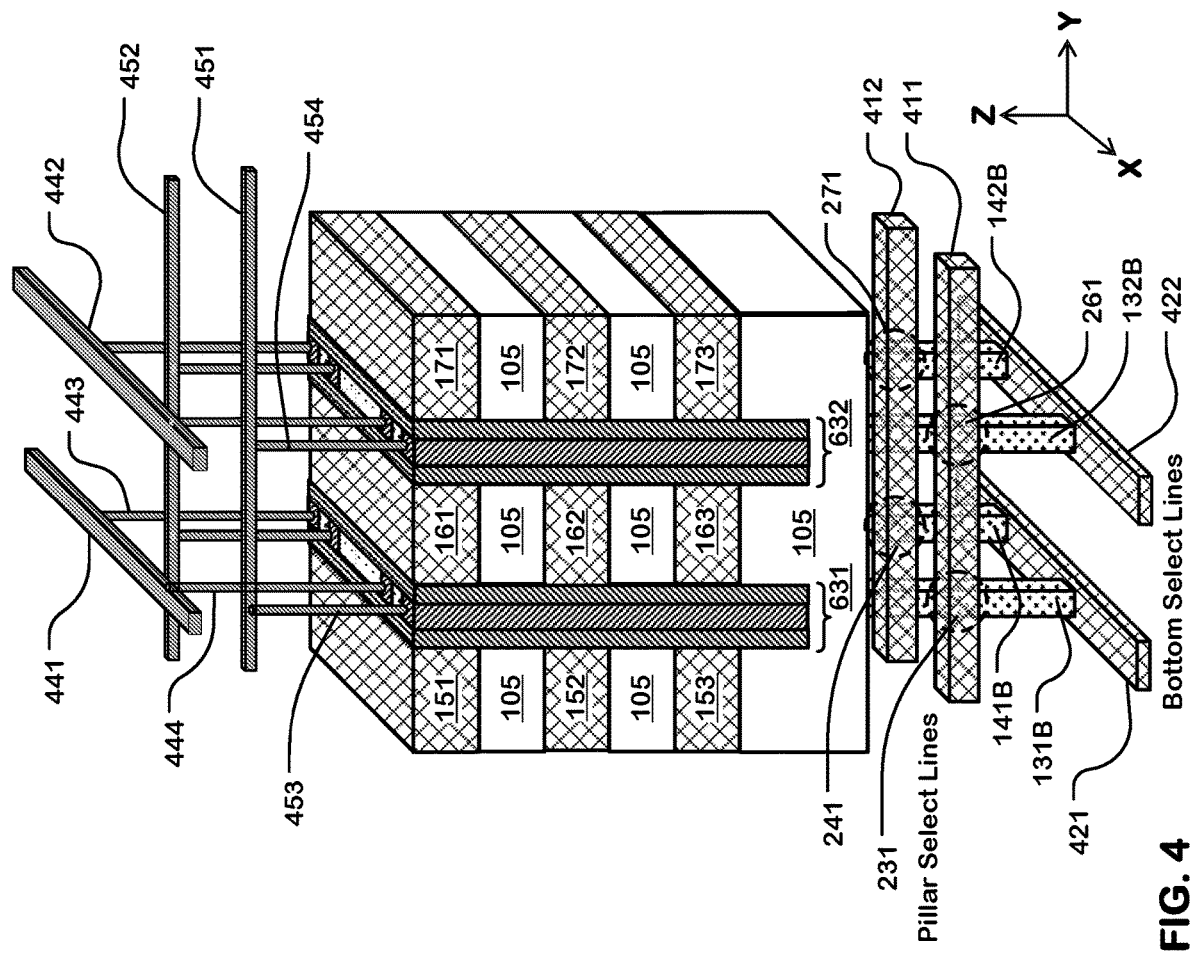
FIG. 4 is a perspective view of a 3D device comprising pillar select lines and bottom select lines.

FIG. 4 is a perspective view of a 3D device comprising pillar select lines and bottom select lines. As shown in the example of FIG. 4, a plurality of pillar select lines (411, 412) is disposed beneath the first and second vertical conductive lines (131S, 131D, 141S, 141D, 132S, 132D, 142S, 142D, FIG. 3) in the columns of cells. Each of the pillar select lines is adjacent to and separated by a gate dielectric (235, FIG. 2) from a row of vertical semiconductor bodies (131B, 132B; 141B, 142B) to form a row of pillar select switches (231, 261; 241, 271).

A plurality of bottom select lines (421, 422) is disposed beneath the pillar select lines and insulated from the pillar select lines and the first and second vertical conductive lines in the columns of cells. Each of the bottom select lines (e.g. 421, 422) is in current-flow contact with a column of vertical semiconductor bodies (e.g. 131B, 141B; 132B, 142B).

As shown in the example of FIG. 4, conductive strips in the stacks (151-153, 161-163, 171-173) are separated by trenches (631, 632). The pillar select lines (411, 412) can be coupled to the vertical semiconductor bodies in respective rows of pillars arranged across multiple trenches. For instance, the pillar select line 411 is coupled to the vertical semiconductor bodies 131B and 132B (FIG. 3) in a row of pillars arranged across trenches 631 and 632. Similarly, the pillar select line 412 is coupled to the vertical semiconductor bodies 141B and 142B (FIG. 3) in another row of pillars arranged across trenches 631 and 632.

As shown in the example of FIG. 4, the bottom select lines (421, 422) are coupled to the vertical semiconductor bodies of pillars arranged along respective trenches. For instance, the bottom select line 421 is coupled to the vertical semiconductor bodies 131B and 141B of pillars arranged along the trench 631. Similarly, the bottom select line 422 is coupled to the vertical semiconductor bodies 132B and 142B of pillars arranged along the trench 632. The bottom select lines (421, 422) can extend in a first direction (X-direction), and the pillar select lines (411, 412) can extend in a second direction (Y-direction) orthogonal to the first direction.

In this configuration, the pillar select switch can be used to connect the vertical semiconductor body to the bottom select line and to disconnect the vertical semiconductor body to the bottom select line for the purposes of applying bias voltages or currents to the vertical semiconductor body that are different from the voltages or currents applied to the first and second vertical conductive lines.

As shown in the example of FIG. 4, the device can include first horizontal conductive lines (441, 442) overlying the stacks and coupled to the first vertical conductive lines of pillars arranged along respective trenches. For instance, a first horizontal conductive line 441 is disposed overlying the stacks and coupled to the first vertical conductive lines (131S, 141S, FIG. 3) of pillars arranged along the trench 631. First interlayer connectors (e.g. 443, 444) can connect the first horizontal conductive line (441) to the first vertical conductive lines (131S, 141S) in a trench 631.

As shown in the example of FIG. 4, the device can include second horizontal conductive lines (451, 452) overlying the stacks and coupled to the second vertical conductive lines in respective rows of pillars arranged across multiple trenches. For instance, a second horizontal conductive line 451 is disposed overlying the stacks and coupled to the second vertical conductive lines (131D, 132D, FIG. 3) in a row of pillars arranged across trenches 631 and 632. Second interlayer connectors (e.g. 453, 454) can connect the second horizontal conductive line (451) to the second vertical conductive lines (131D, 132D) in adjacent trenches 631 and 632.

The first horizontal conductive lines (441, 442) can extend in a first direction (X-direction), and the second horizontal conductive lines (451, 452) can extend in a second direction (Y-direction) orthogonal to the first direction.

Figure 5:
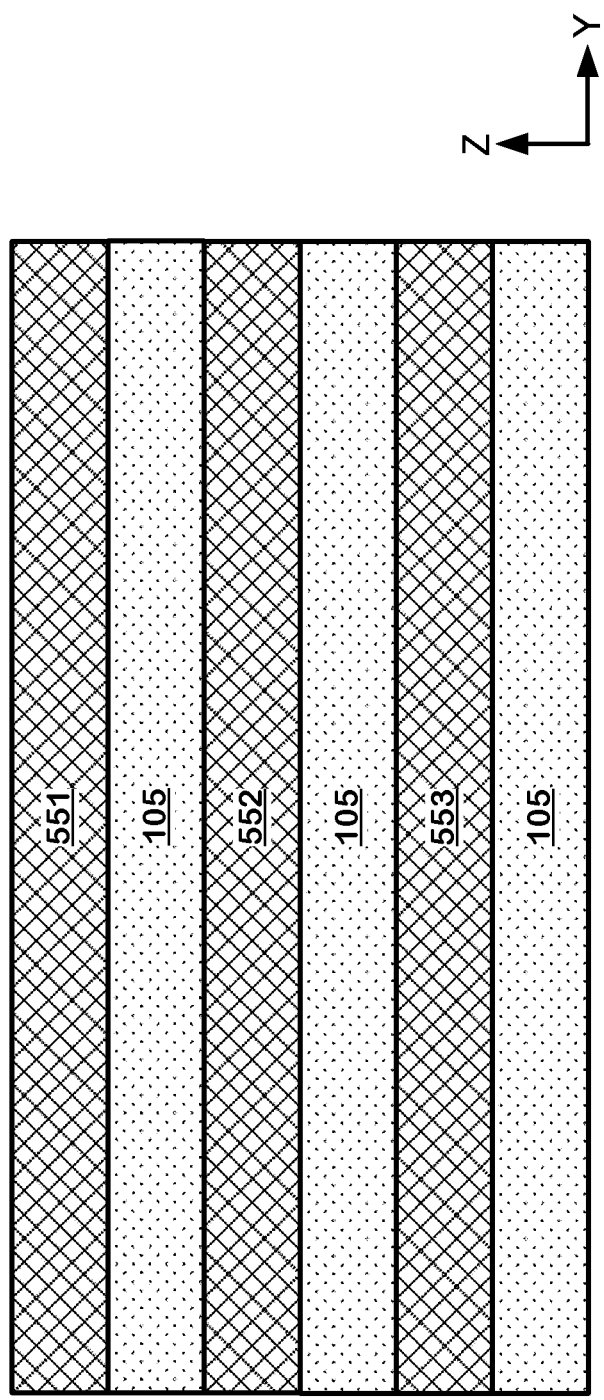

FIGS. 5, 6A-14A and 6B-14B illustrate an example process flow for manufacturing an array of columns of cells in multiple levels of word lines, each of the columns including a pillar comprising a first vertical conductive line, a second vertical conductive line, and a vertical semiconductor body disposed between and in contact with the first and second vertical conductive lines FIG. 5 illustrates a stage of the process flow after forming a stack of conductive layers (e.g. 551, 552, 553) separated by insulating material 105, such as silicon oxide. The conductive layers can comprise a variety of materials including polysilicon, doped semiconductors, metals, and conductive compounds, including materials comprising Si, Ge, SiGe, SiC, TiN, TaN, W, and Pt.

Figure 6A:
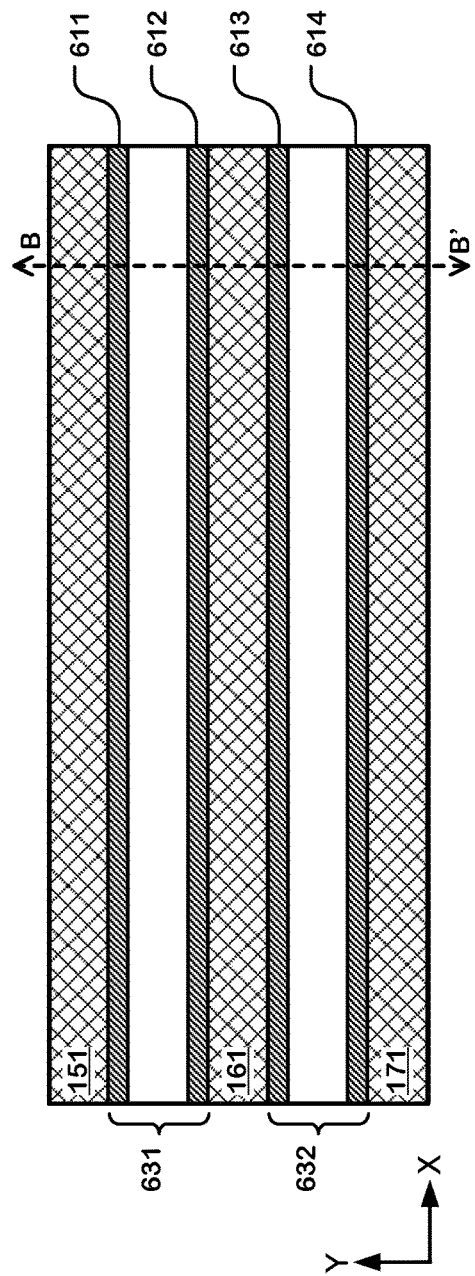
Figure 6B:
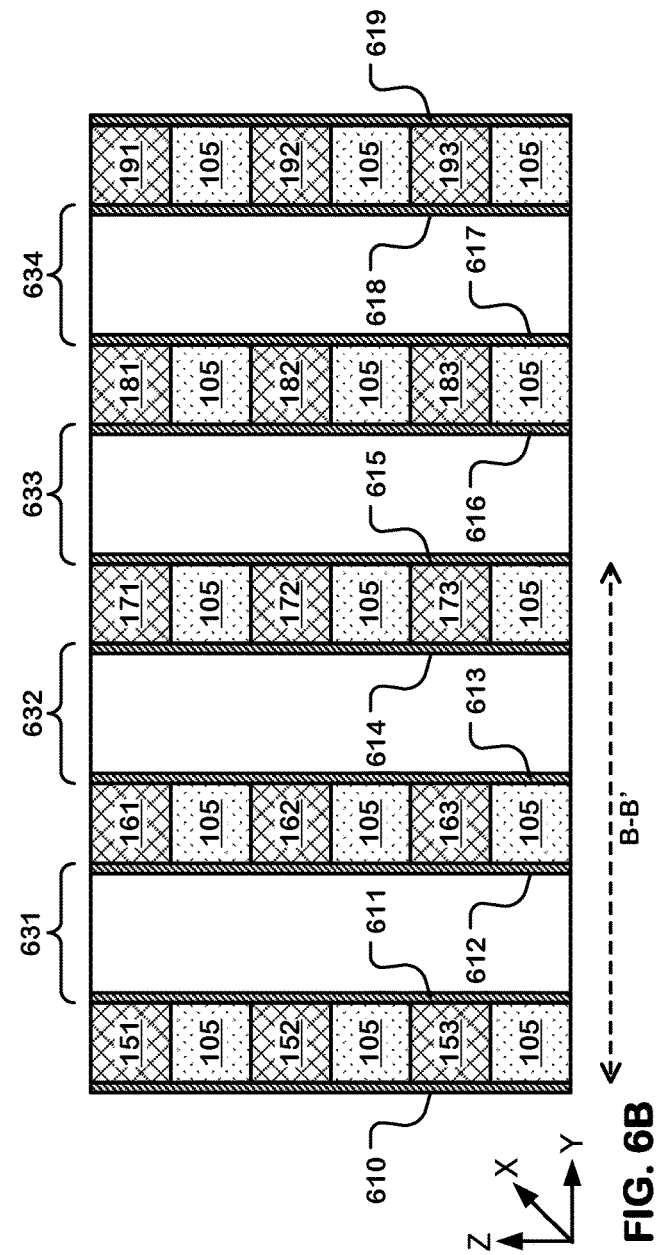

FIGS. 6A and 6B illustrate a stage of the process flow after forming a plurality of stacks of conductive strips (151-153, 161-163, 171-173, 181-183, 191-193) separated by trenches (e.g. 631-634). FIG. 6A is a top view of the structure at this stage. FIG. 6B is a vertical cross-sectional view of the structure taken along a line B-B' as shown in FIG. 6A. The stacks and the trenches can be formed by etching the stack of conductive layers as shown in FIG. 5. The conductive strips in the stacks extend in a first direction (X-direction). Each of the stacks has a first sidewall and a second sidewall opposite the first sidewall in a second direction (Y-direction) orthogonal to the first direction. Conductive strips in a stack are separated by insulating material 105.

At this stage in the process, charge storage structures can be formed on sidewalls of conductive strips in the stacks of conductive strips. For instance, charge storage structures (610-619) can be formed on first and second sidewalls of conductive strips in the stacks of conductive strips (151-153, 161-163, 171-173, 181-183, 191-193).

Figure 7A:
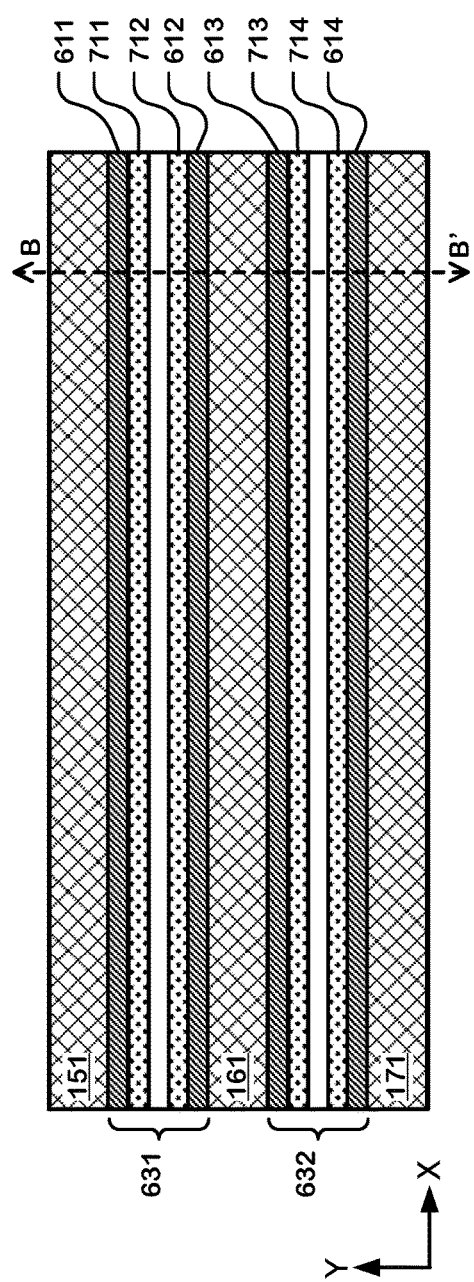
Figure 7B:
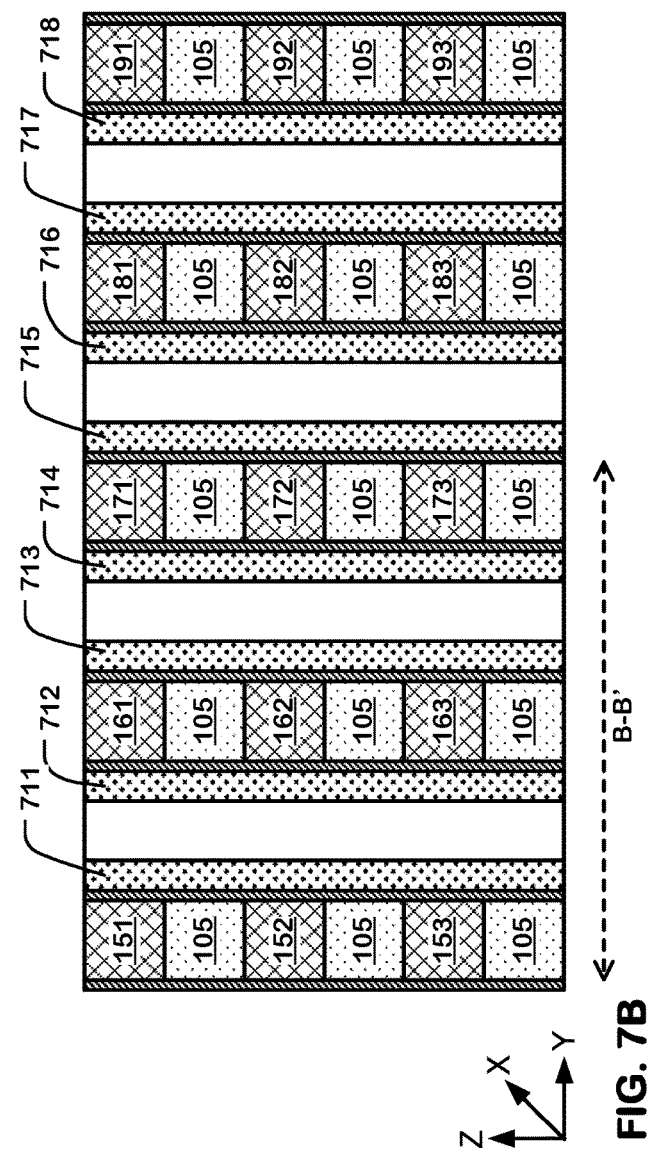

FIGS. 7A and 7B illustrate a stage of the process flow after forming a layer of semiconductor materials 711-718 over the charge storage structures (611-618, FIG. 6B) on sidewalls of conductive strips in the stacks of conductive strips. The layer of semiconductor materials can comprise materials as Si, Ge, SiGe, GaAs, and SiC, and can be adapted to act as channels for the memory cells. FIG. 7A is a top view of the structure at this stage. FIG. 7B is a vertical cross-sectional view of the structure taken along a line B-B' as shown in FIG. 7A. The layer of channel material can comprise semiconductor materials such as Si, Ge, SiGe, GaAs, and SiC.

FIGS. 8A and 8B illustrate a stage of the process flow after filling the trenches with an insulating material 810, and forming a recess 820 over the insulating material at upper ends of the trenches. FIG. 8A is a top view of the structure at this stage. FIG. 8B is a vertical cross-sectional view of the structure taken along a line B-B' as shown in FIG. 8A.

Figure 9A:
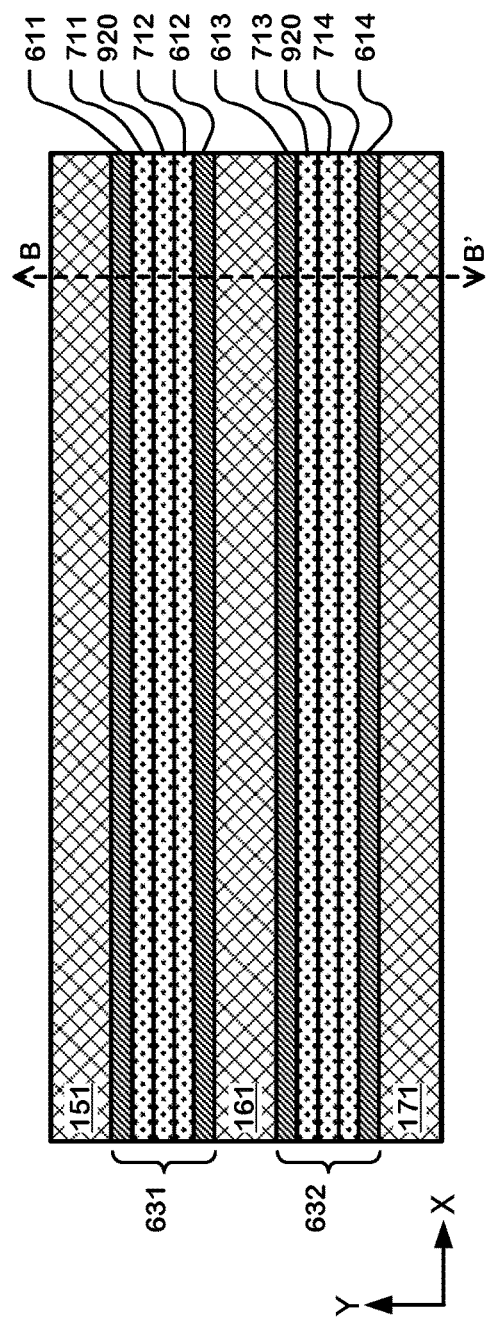
Figure 9B:
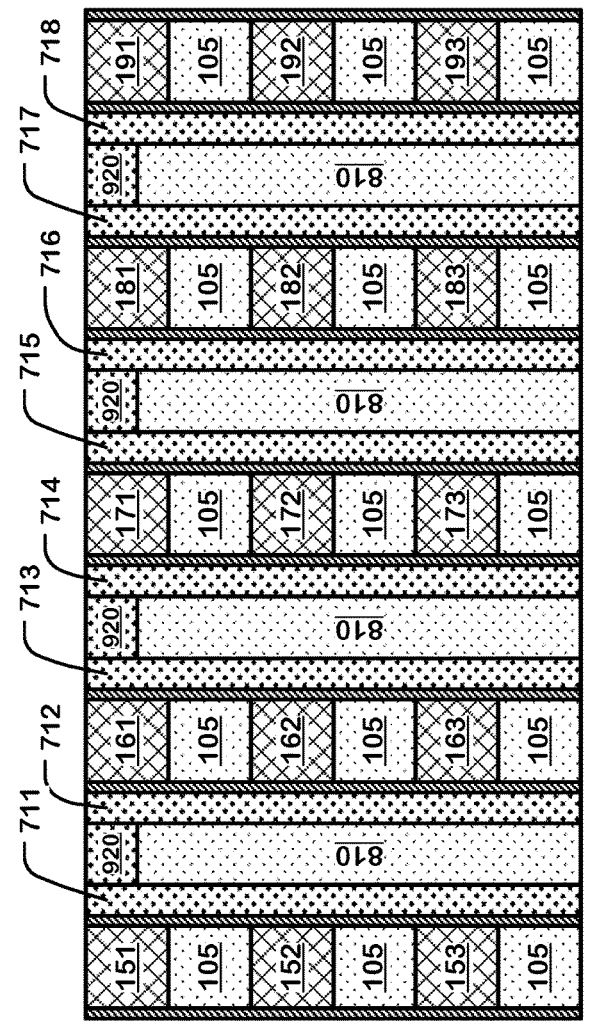

FIGS. 9A and 9B illustrate a stage of the process flow after filling the recess (820, FIG. 8) with a conductive material 920 such as polysilicon for forming plugs. FIG. 9A is a top view of the structure at this stage. FIG. 9B is a vertical cross-sectional view of the structure taken along a line B-B' as shown in FIG. 9A. A chemical mechanical planarization process can be applied to over the structure after the conductive material is deposited in the recess.

FIGS. 10A, 10B, 11A and 11B illustrate stages of the process flow for forming the first and second vertical conductive lines in a first embodiment. FIGS. 10A and 10B illustrate a stage of the process flow after etching holes 1010 through the layer of semiconductor materials 711-718 (FIGS. 9A and 9B), the conductive material 920 (FIGS. 9A and 9B), and the insulating material 810 (FIG. 9B) disposed beneath the conductive material 920 in the trenches (631-634), thereby forming the vertical semiconductor bodies (121B, 131B, 141B, 122B, 132B, 142B) separated by the holes 1010 between adjacent stacks of conductive strips in the trenches (631-634). FIG. 10A is a top view of the structure at this stage. FIG. 10B is a vertical cross-sectional view of the structure taken along a line C-C' as shown in FIG. 10A. At this etch step, all of, part of, or none of the charge storage structures (610-619) adjacent the holes 1010 may remain on sidewalls of conductive strips in the stacks of conductive strips. A vertical semiconductor body has a first width W1 in the first direction (X-direction) along which the conductive strips (151, 161, 171, 181, 191) in the stacks extend.

FIGS. 11A and 11B illustrate a stage of the process flow after forming first vertical conductive lines (121S, 131S, 141S, 122S, 132S, 142S) and second vertical conductive lines (121D, 131D, 141D, 122D, 132D, 142D) on sidewalls of the vertical semiconductor bodies (121B, 131B, 141B, 122B, 132B, 142B). FIG. 11A is a top view of the structure at this stage. FIG. 11B is a vertical cross-sectional view of the structure taken along a line S-S' as shown in FIG. 11A. A conductive material can be deposited in the holes 1010 (FIG. 10) including on sidewalls of the vertical semiconductor bodies. The conductive material can be etched to form the first vertical conductive lines (121S, 131S, 141S, 122S, 132S, 142S) and the second vertical conductive lines (121D, 131D, 141D, 122D, 132D, 142D) on the sidewalls of the vertical semiconductor bodies (121B, 131B, 141B, 122B, 132B, 142B).

Stages of the process flow illustrated in FIGS. 10A, 10B, 11A and 11B can result in columns of cells in multiple levels (131-133, FIG. 3), where each of the columns including a pillar comprising a first vertical conductive line, a second vertical conductive line, and a vertical semiconductor body (Body) disposed between and in contact with the first and second vertical conductive lines. Adjacent columns of cells in a trench are separated by holes 1110.

Figure 12A:
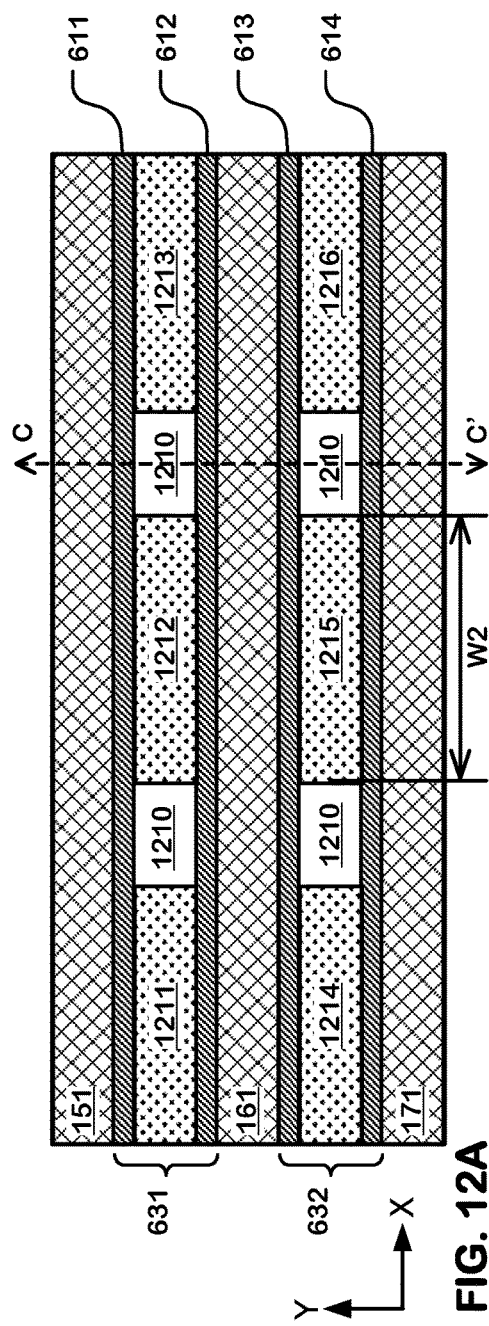
Figure 12B:
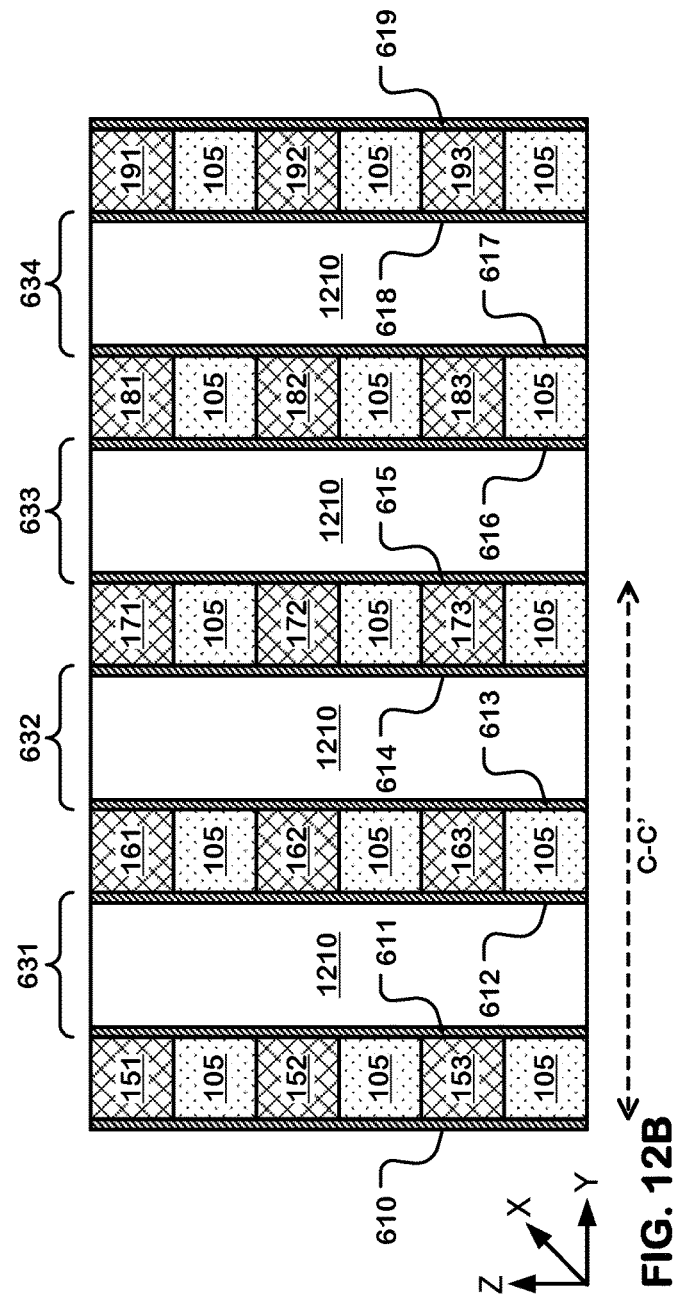

FIGS. 12A, 12B, 13A and 13B illustrate stages of the process flow for forming the first and second vertical conductive lines in a second embodiment. FIGS. 12A and 12B illustrate a stage of the process flow after etching holes 1210 through the layer of semiconductor materials 711-718 (FIGS. 9A and 9B), the conductive material 920 (FIGS. 9A and 9B), and the insulating material 810 (FIG. 9B) disposed beneath the conductive material 920 in the trenches (631-634), thereby forming vertical islands (1211-1216) separated by the holes 1210 between adjacent stacks of conductive strips in the trenches (631-634). FIG. 12A is a top view of the structure at this stage. FIG. 12B is a vertical cross-sectional view of the structure taken along a line C-C' as shown in FIG. 12A. At this etch step, all of, part of, or none of the charge storage structures (610-619) adjacent the holes 1210 may remain on sidewalls of conductive strips in the stacks of conductive strips. A vertical semiconductor body has a second width W2 in the first direction (X-direction) along which the conductive strips (151, 161, 171, 181, 191) in the stacks extend. The second width W2 is wider than the first width W1 of a vertical semiconductor body in the first embodiment illustrated by FIG. 10A, so the first and second vertical conductive lines of a column of cells can be formed within the second width.

Figure 13A:
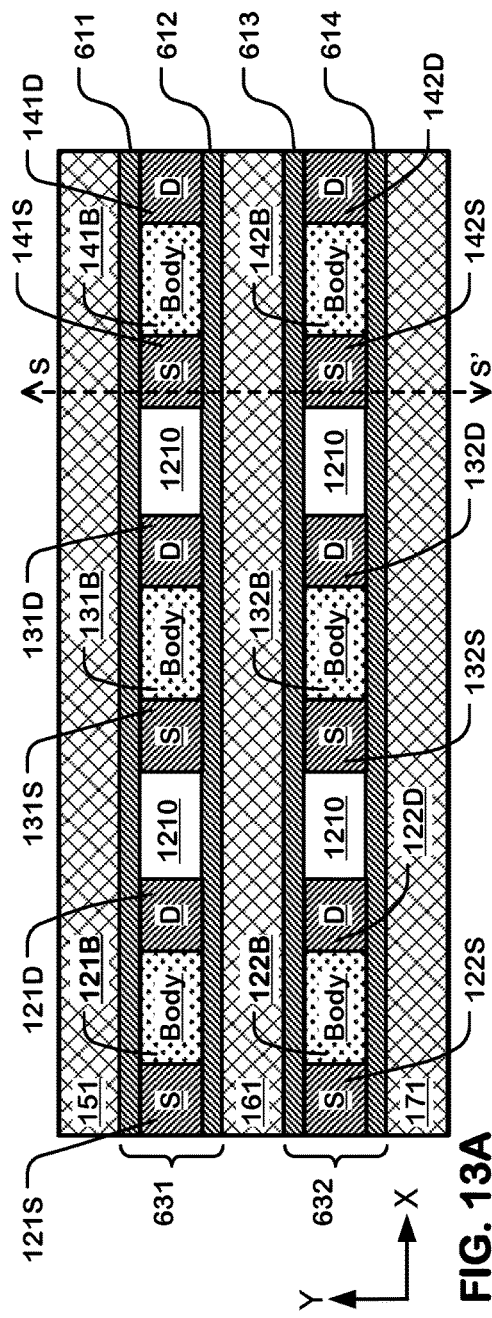
Figure 13B:
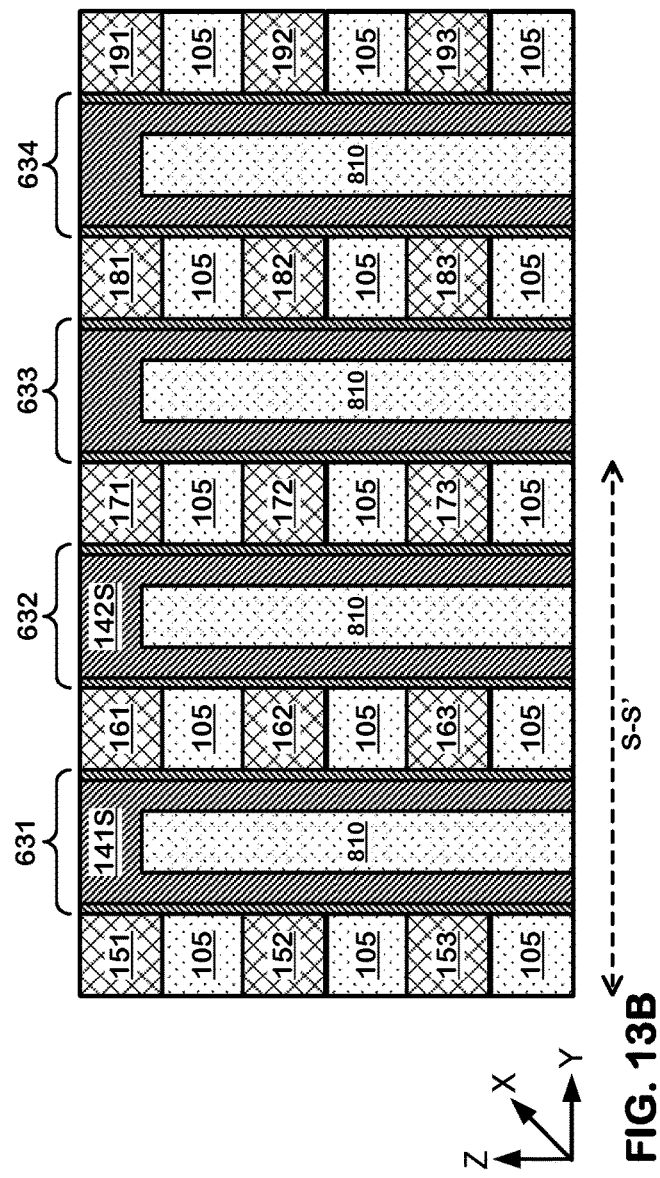

FIGS. 13A and 13B illustrate a stage of the process flow after forming first vertical conductive lines (121S, 131S, 141S, 122S, 132S, 142S) and second vertical conductive lines (121D, 131D, 141D, 122D, 132D, 142D) on sidewalls of the vertical semiconductor bodies (121B, 131B, 141B, 122B, 132B, 142B). FIG. 13A is a top view of the structure at this stage. FIG. 13B is a vertical cross-sectional view of the structure taken along a line S-S' as shown in FIG. 13A. In the second embodiment, plasma doping can be used on the semiconductor materials on sidewalls of the vertical islands 1211-1216 (FIG. 12A) via the holes 1210 (FIGS. 12A, 12B) to form the first vertical conductive lines (121S, 131S, 141S, 122S, 132S, 142S) and the second vertical conductive lines (121D, 131D, 141D, 122D, 132D, 142D).

Stages of the process flow illustrated in FIGS. 12A, 12B, 13A and 13B can result in columns of cells in multiple levels (131-133, FIG. 3), where each of the columns including a pillar comprising a first vertical conductive line, a second vertical conductive line, and a vertical semiconductor body (Body) disposed between and in contact with the first and second vertical conductive lines. Adjacent columns of cells in a trench are separated by holes 1210.

Figure 14A:
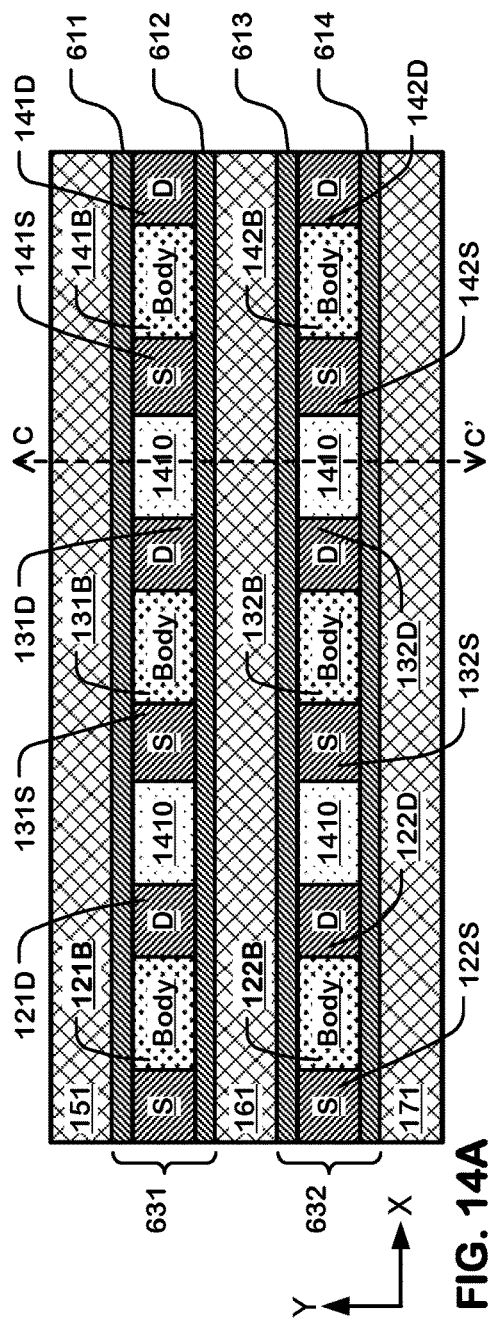
Figure 14B:
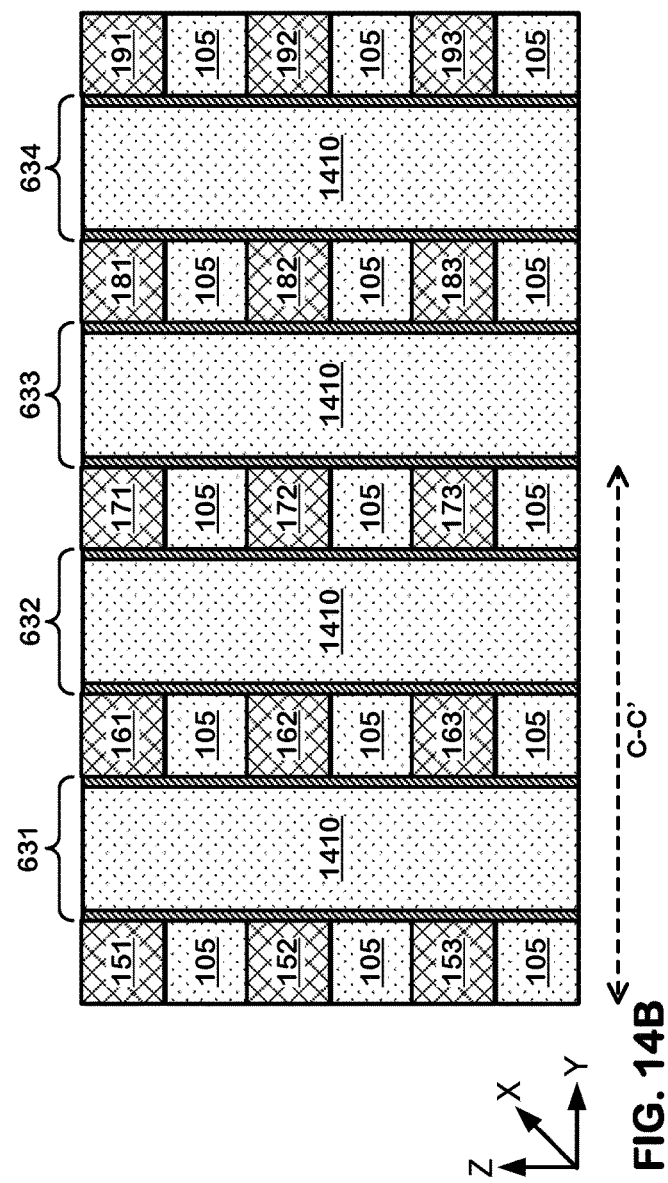

FIGS. 14A and 14B illustrate a stage of the process flow after filling the holes (1110, FIG. 11A; 1210, FIG. 13A) that separate adjacent columns of cells in a trench with insulating material 1410. FIG. 14A is a top view of the structure at this stage. FIG. 14B is a vertical cross-sectional view of the structure taken along a line C-C' as shown in FIG. 14A.

FIGS. 15-18 illustrate stages of the example process flow for forming first and second horizontal conductive lines overlying the stacks and coupled to the first and second vertical conductive lines of the pillars. The first horizontal conductive lines (1831-1834, FIG. 18) can extend in a first direction (X-direction), and the second horizontal conductive lines (1621-1641, FIG. 16) can extend in a second direction orthogonal to the first direction. The first and second horizontal conductive lines can be disposed at different metal levels. As described in reference to FIGS. 16-18, the first horizontal conductive lines are disposed at a metal level higher than the second horizontal conductive lines. Alternatively, the first horizontal conductive lines can be disposed at a metal level lower than the second horizontal conductive lines.

Figure 15:
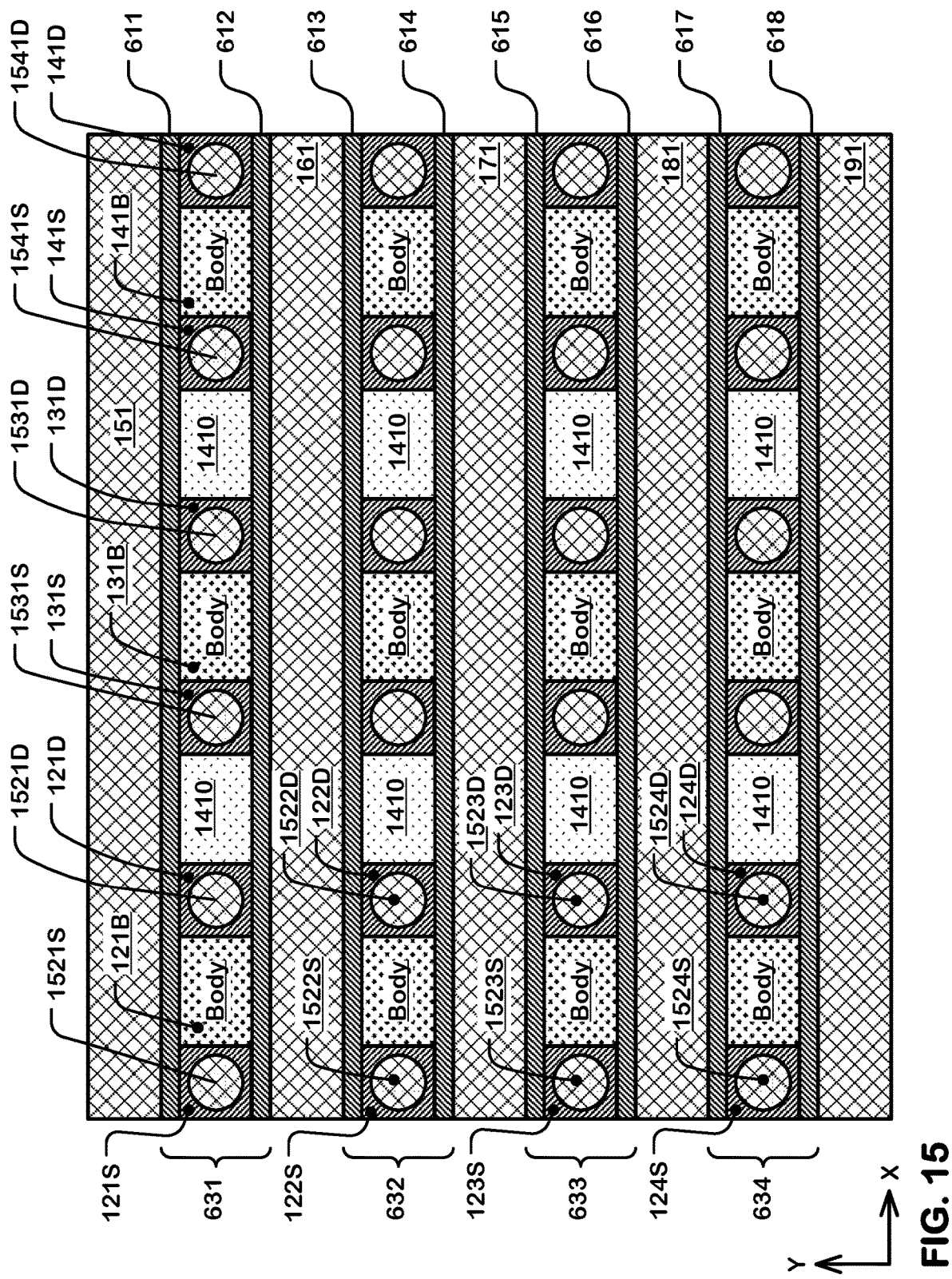
FIGS. 15-18 illustrate stages of the example process flow for forming first and second horizontal conductive lines overlying the stacks and coupled to the first and second vertical conductive lines in the columns of cells.

FIG. 15 illustrates a stage of the process flow after forming contacts (1521S, 1521D; 1531S, 1531D; 1541S, 1541D; 1522S, 1522D; 1523S, 1523D; 1524S, 1524D) over and in contact with first and second vertical conductive lines (121S, 121D; 131S, 131D; 141S, 141D; 122S, 122D; 123S, 123D; 124S, 124D) in respective columns of cells. The contacts can include a conductive material.

Figure 16:
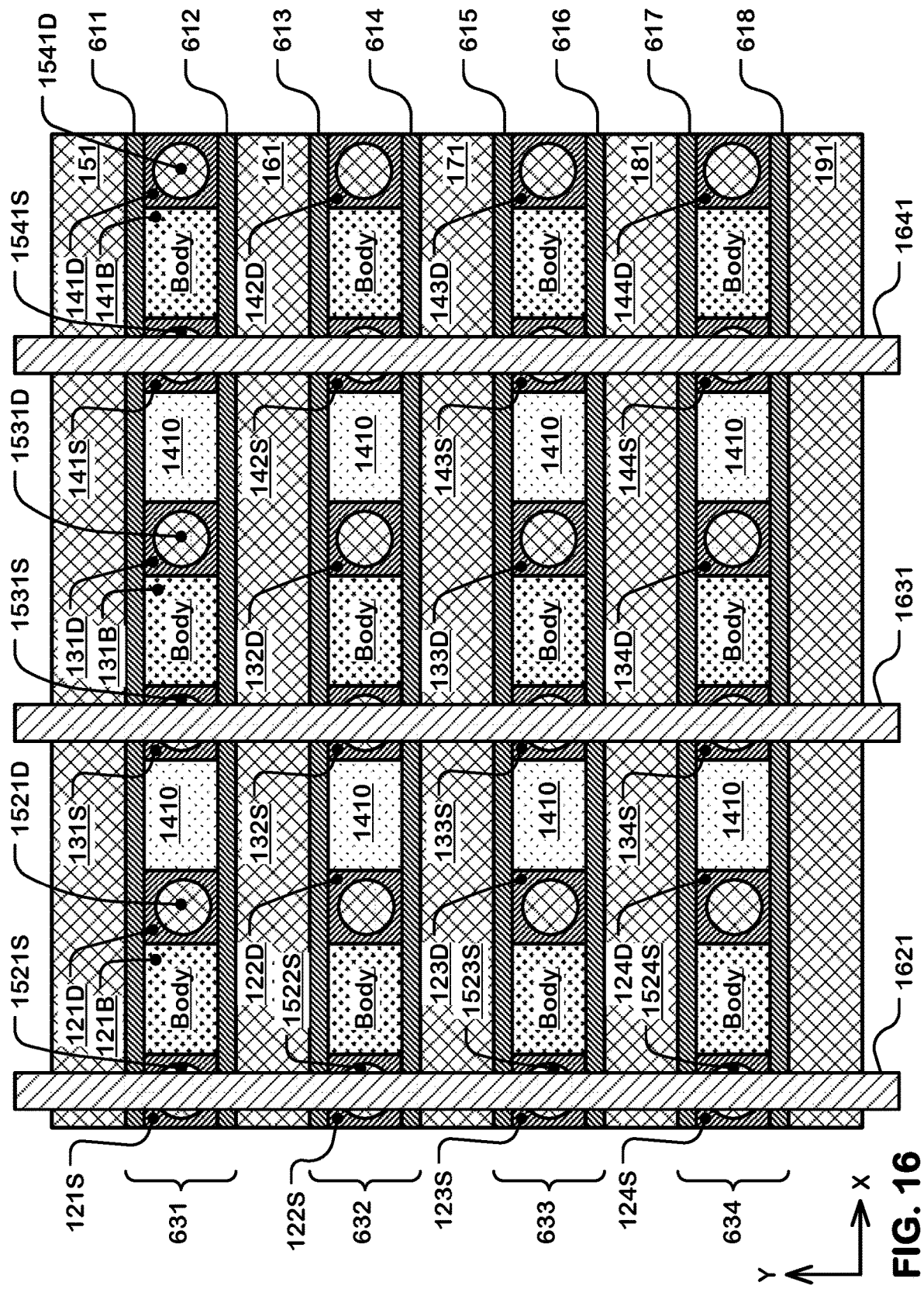

FIG. 16 illustrates a stage of the process flow after forming second horizontal conductive lines (e.g. 1621) overlying the stacks and coupled to the first vertical conductive lines (121S, 122S, 123S, 124S) in respective rows of pillars arranged across multiple trenches (631-634) via respective contacts (1521S, 1522S, 1523S, 1524S). In this example, the contacts can act as interlayer connectors connecting the second horizontal conductive line (1621) to the first vertical conductive lines (121S, 122S, 123S, 124S) in respective rows of pillars arranged across multiple trenches (631-634). Alternatively, the second horizontal conductive lines (1621, 1631, 1641) can be coupled to the second vertical conductive lines (121D, 122D, 123D, 124D) in respective rows of pillars arranged across multiple trenches (631-634).

Figure 17:
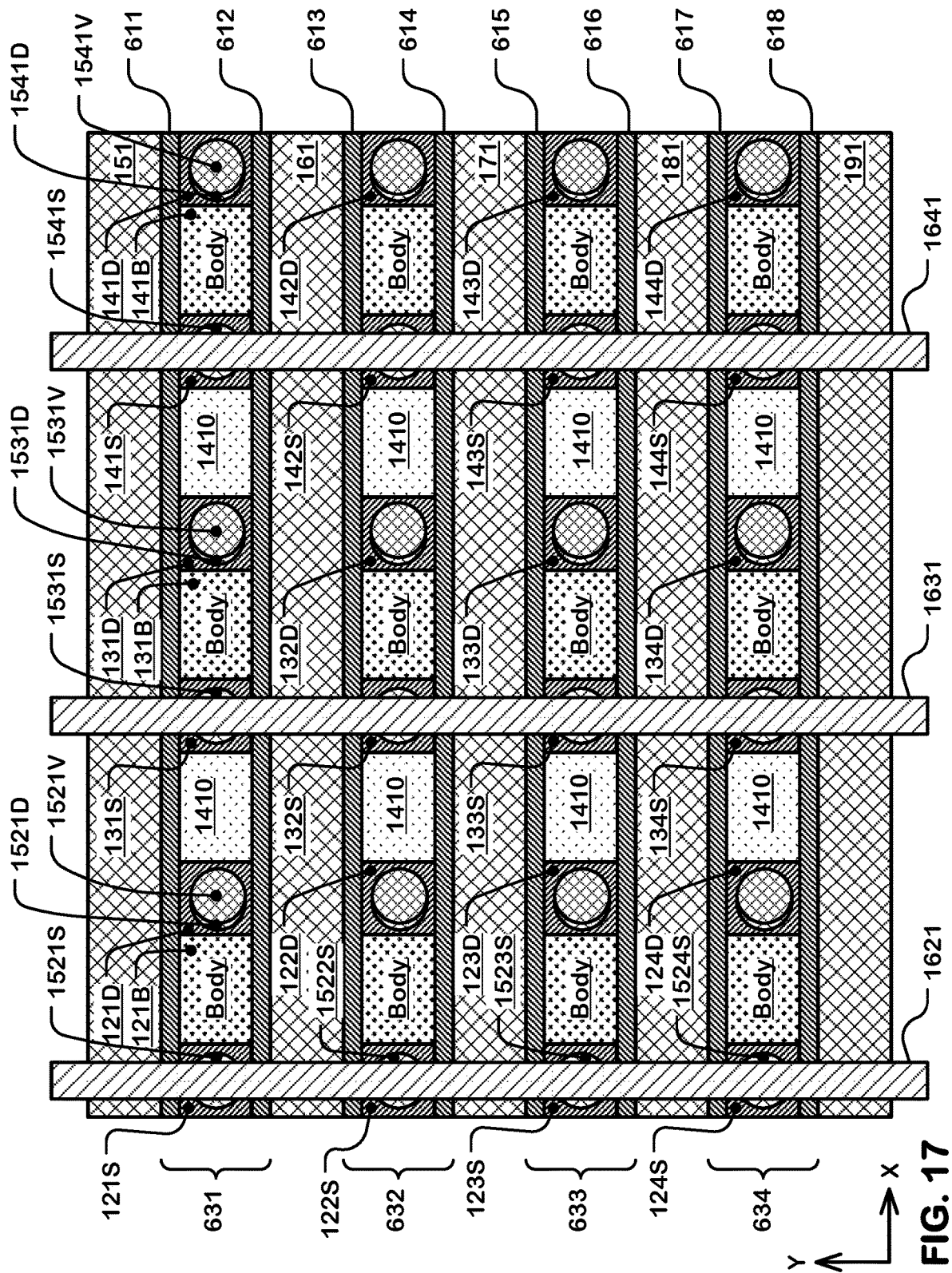

FIG. 17 illustrates a stage of the process flow after forming vias (1521V, 1531V, 1541V) over and in contact with the contacts (1521D, 1531D, 1541D) over the second vertical conductive lines (121D; 131D; 141D) in respective pillars. The vias can include a conductive material.

Figure 18:
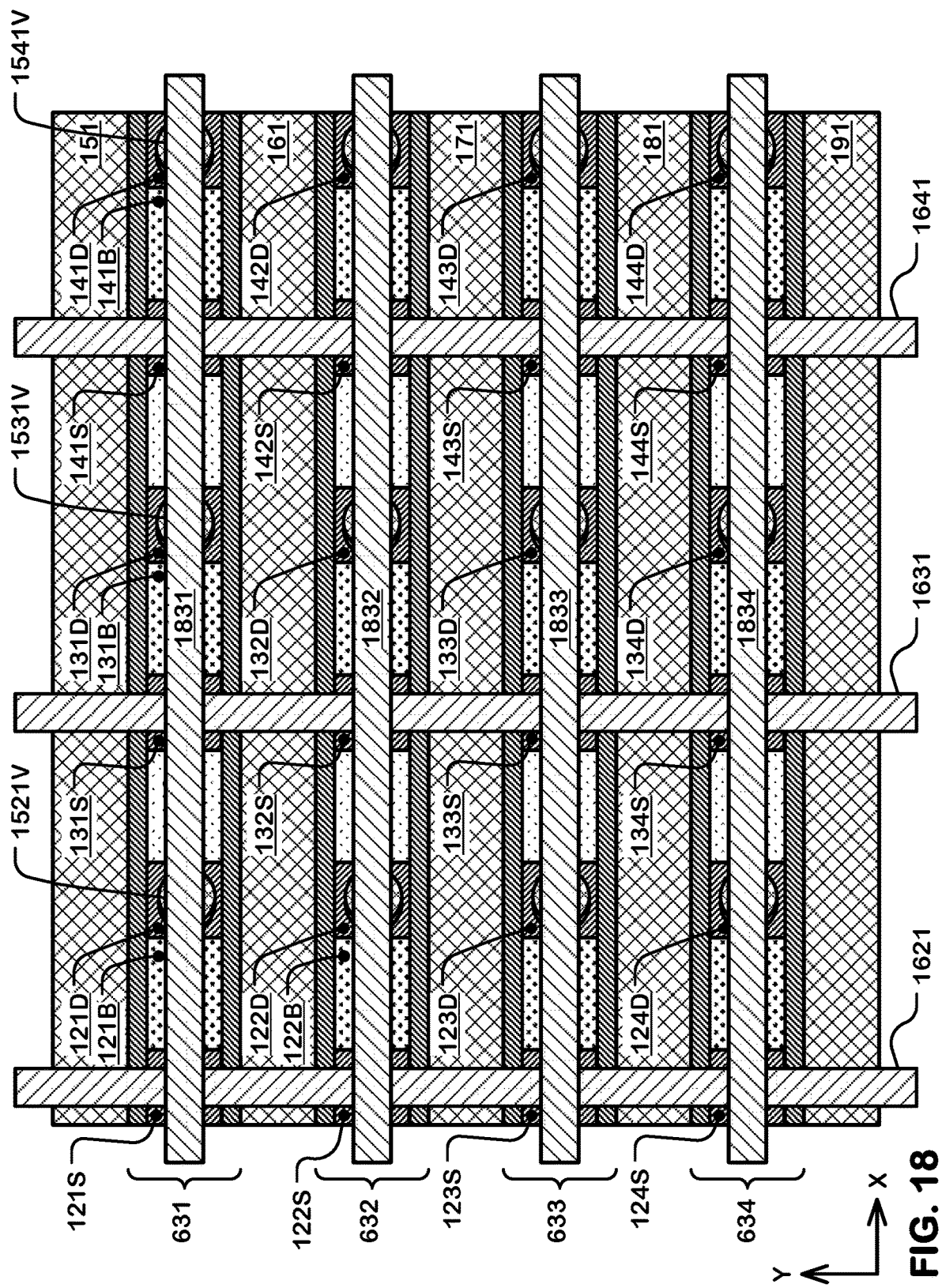

FIG. 18 illustrates a stage of the process flow after forming first horizontal conductive lines (1831, 1832, 1833, 1834) overlying the stacks and coupled to the second vertical conductive lines (121D, 131D, 141D; 122D, 132D, 142D; 123D, 133D, 143D; 124D, 134D, 144D) of pillars arranged along respective trenches (631, 632, 633, 634). In this example, the vias (1521V, 1531V, 1541V) and respective contacts (1521D, 1531D, 1541D, FIG. 17) can act as interlayer connectors connecting the first horizontal conductive line (1831) to the second vertical conductive lines (121D, 131D, 141D) of pillars arranged along the trench 631.

Alternatively, the first horizontal conductive lines (1831, 1832, 1833, 1834) can be coupled to the first vertical conductive lines (121S, 131S, 141S; 122S, 132S, 142S; 123S, 133S, 143S; 124S, 134S, 144S) of pillars arranged along respective trenches, and the second horizontal conductive lines (1621, 1631, 1641) can be coupled to the second conductive lines (121D, 122D, 123D, 124D; 131D, 132D, 133D, 134D; 141D, 142D, 143D, 144D).

FIGS. 19A and 19B illustrate results from forming pillar select lines and bottom select lines. FIG. 19A is a top view of the structure. FIG. 19B is a vertical cross-sectional view of the structure taken along a line B-B' in the second direction (Y-direction) as shown in FIG. 19A. FIG. 19B illustrates vertical semiconductor bodies (141B, 142B, 143B, 144B) in a row of pillars arranged across multiple trenches (631, 632, 633, 634). As shown in this example, the vertical semiconductor bodies (141B, 142B, 143B, 144B) can include the layer of semiconductor materials (711-718, FIGS. 9A and 9B) over the charge storage structures (611-618, FIGS. 6A and 6B) on sidewalls of conductive strips in the stacks (151-153, 161-163, 171-173, 181-183, 191-193), and the conductive material (920, FIGS. 9A and 9B) over an insulating material (810) that fills the trenches.

As shown in this example, a pillar select line 230 is disposed beneath the conductive strips in the stacks (151-153, 161-163, 171-173, 181-183, 191-193). The pillar select line 230 is adjacent to and separated by a gate dielectric 235 from a row of vertical semiconductor bodies (141B, 142B, 143B, 144B) to form a row of pillar select switches (1901-1904).

A plurality of bottom select lines (1931-1934) is disposed beneath the pillar select line 230 and insulated from the pillar select lines for example by insulating material 105. The bottom select lines (1931, 1932, 1933, 1934) are in current-flow contact with respective vertical semiconductor bodies (141B, 142B, 143B, 144B). The bottom select lines can extend in a first direction (X-direction), and the pillar select lines can extend in a second direction (Y-direction) orthogonal to the first direction.

Figure 20A:
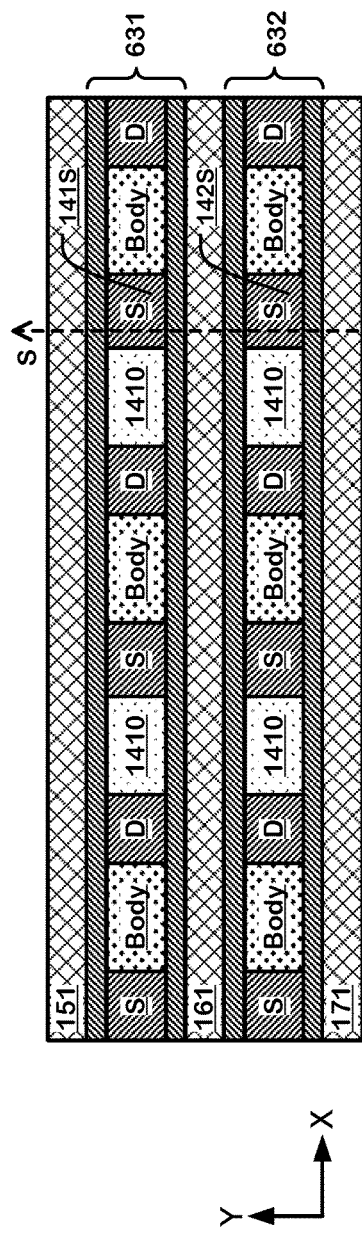
FIGS. 20A and 20B illustrate a stage of the process flow after forming first horizontal conductive lines overlying the stacks and coupled to the first vertical conductive lines.
Figure 20B:
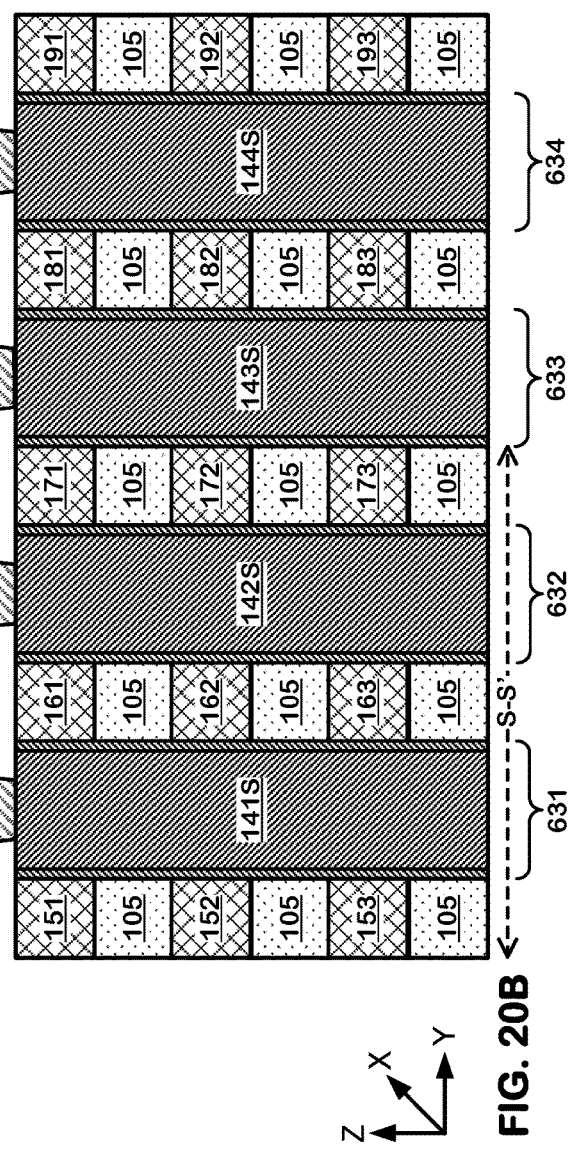

FIGS. 20A and 20B illustrate a stage of the process flow after forming first horizontal conductive lines (2041-2044) overlying the stacks of conductive strips (151-153, 161-163, 171-173, 181-183) and coupled to the first vertical conductive lines (141S-144S) of pillars arranged along respective trenches (631-634). FIG. 20A is a top view of the structure at this stage. FIG. 20B is a vertical cross-sectional view of the structure taken along a line S-S' as shown in FIG. 20A. The first horizontal conductive lines (2041-2044) are connected to the first vertical conductive lines (141S-144S) via interlayer connectors (2041V-2044V).

Figure 21A:
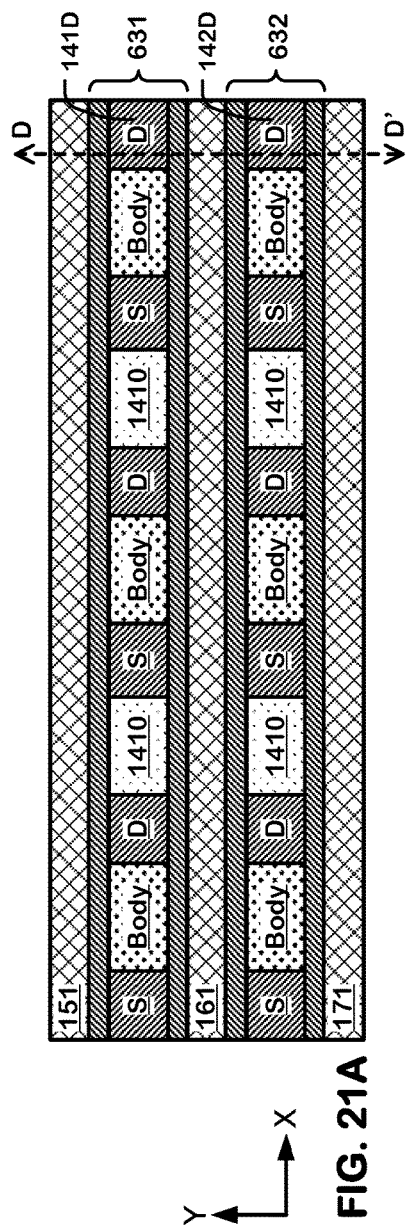
FIGS. 21A and 21B illustrate a stage of the process flow after forming second horizontal conductive lines overlying the stacks and coupled to the second vertical conductive lines.
Figure 21B:
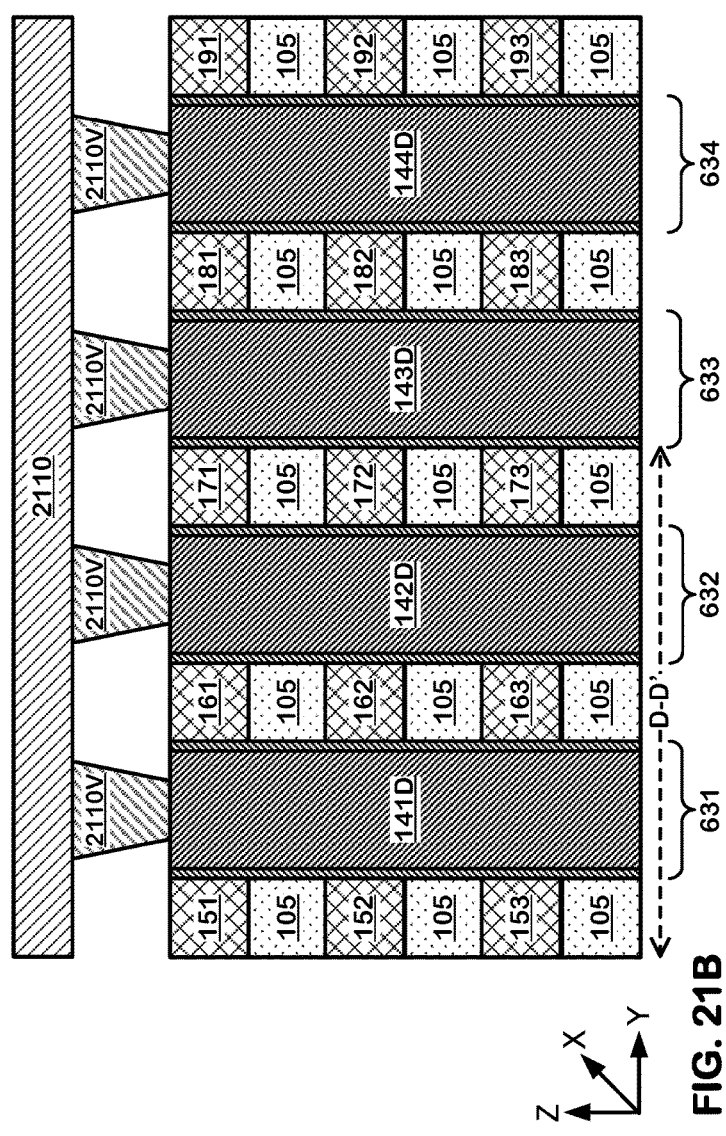

FIGS. 21A and 21B illustrate a stage of the process flow after forming second horizontal conductive lines overlying the stacks of conductive strips (151-153, 161-163, 171-173, 181-183) and coupled to the second vertical conductive lines (141D-144D) in respective rows of pillars arranged across multiple trenches. FIG. 21A is a top view of the structure at this stage. FIG. 21B is a vertical cross-sectional view of the structure taken along a line D-D' as shown in FIG. 21A. In this example, a second horizontal conductive line (2110) is coupled to the second vertical conductive lines (141D-144D) in a row of pillars arranged across multiple trenches (631-634) through interlayer connectors 2110V. The first horizontal conductive lines can extend in a first direction (X-direction), and the second horizontal conductive lines can extend in a second direction (Y-direction) orthogonal to the first direction.

Figure 22:
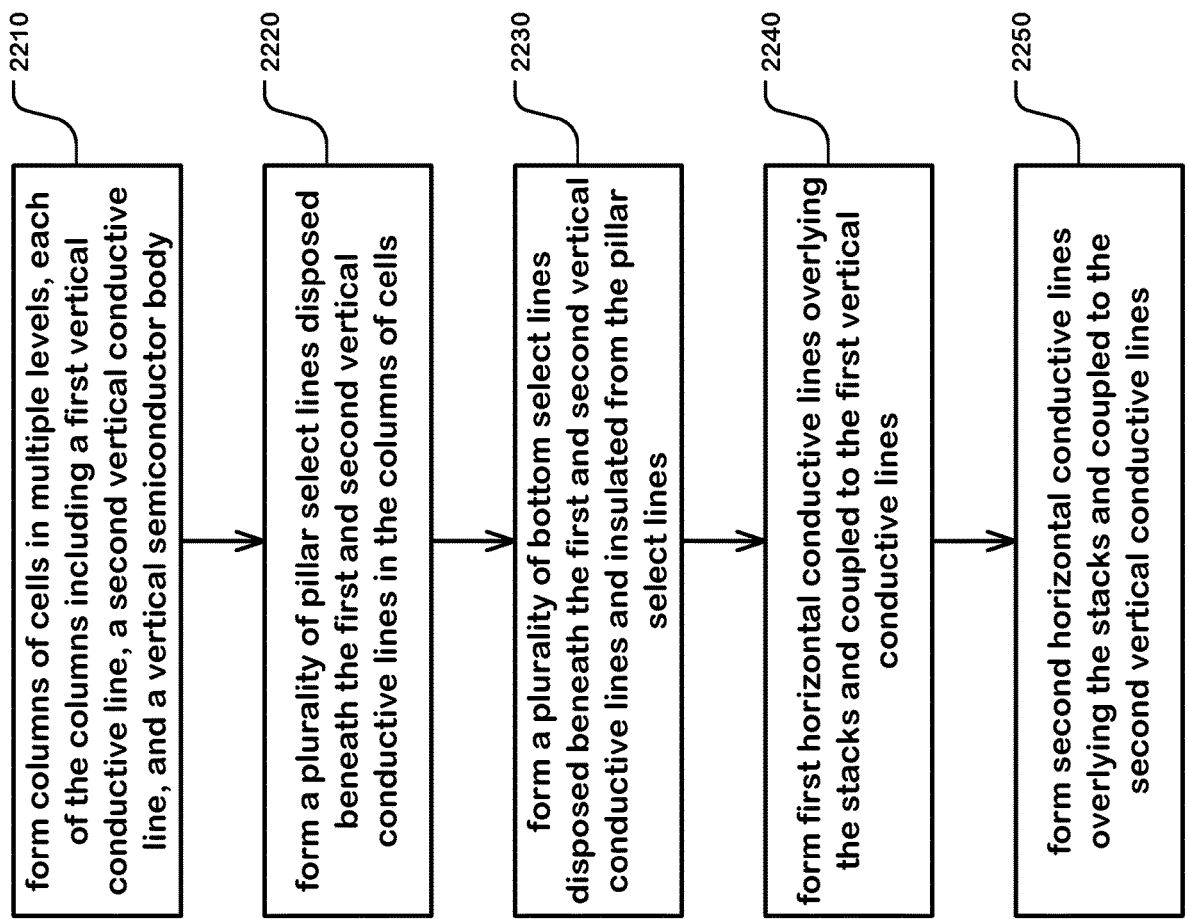
FIG. 22 illustrates a flowchart for an example process flow for manufacturing a device as described herein.

FIG. 22 illustrates a flowchart for an example process flow for manufacturing a device as described herein. At Step 2210, columns of cells in multiple levels of word lines can be formed, where each of the columns can include a pillar comprising a first vertical conductive line, a second vertical conductive line, and a vertical semiconductor body disposed between and in contact with the first and second vertical conductive lines. Columns of cells are further described at least in reference to FIGS. 1-5, 6A-14A and 6B-14B.

At Step 2220, a plurality of pillar select lines can be formed, where the pillar select lines can be disposed beneath the first and second vertical conductive lines in the columns of cells. Each of the pillar select lines can be adjacent to and separated by a gate dielectric from a row of vertical semiconductor bodies to form a row of pillar select switches. Pillar select lines are further described at least in reference to FIGS. 2, 4, 19A and 19B.

At Step 2230, a plurality of bottom select lines can be formed, where the bottom select lines can be disposed beneath the first and second vertical conductive lines and insulated from the pillar select lines and the first and second vertical conductive lines in the columns of cells. Each of the bottom select lines can be in current-flow contact with a column of vertical semiconductor bodies. Bottom select lines are further described at least in reference to FIGS. 2, 4, 19A and 19B.

At Step 2240, first horizontal conductive lines overlying the stacks can be formed, where the first horizontal conductive lines can be coupled to the first vertical conductive lines of pillars arranged along respective trenches.

At Step 2250, second horizontal conductive lines overlying the stacks can be formed, where the second horizontal conductive lines can be coupled to the second vertical conductive lines in respective rows of pillars arranged across multiple trenches.

The first horizontal conductive lines can extend in a first direction, and the second horizontal conductive lines can extend in a second direction orthogonal to the first direction. The first and second horizontal conductive lines are further described at least in reference to FIGS. 2, 4 and 15-18. The order in which the steps are shown do not necessarily indicate the order in which the steps are executed. For instance, Steps 2210, 2220 and 2230 can be executed in order of 2230→2220→2210, and Steps 2240 and 2250 can be executed in order of 2250→2240.

Figure 23:
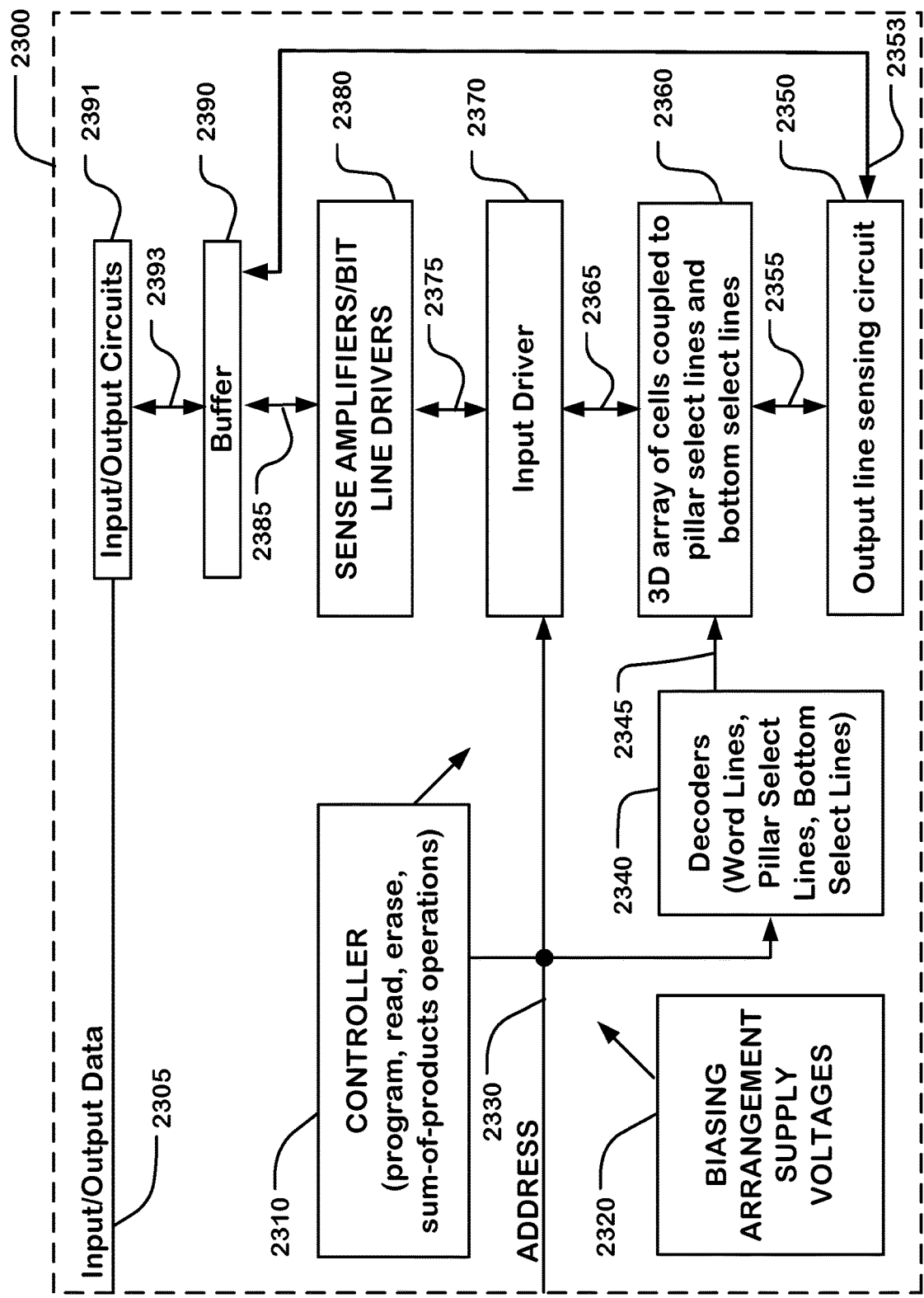
FIG. 23 is a simplified chip block diagram of an integrated circuit device including a 3D array of cells.

FIG. 23 is a simplified chip block diagram of an integrated circuit device including a 3D array of cells 2360. The 3D array 2360 includes columns of cells in multiple levels, where each of the columns includes a pillar comprising a first vertical conductive line, a second vertical conductive line, and a vertical semiconductor body disposed between and in contact with the first and second vertical conductive lines. A plurality of pillar select lines is disposed beneath the first and second vertical conductive lines in the columns of cells, where each of the pillar select lines is adjacent to and separated by a gate dielectric from a row of vertical semiconductor bodies to form a row of pillar select switches. A plurality of bottom select lines is disposed beneath the pillar select lines and insulated from the pillar select lines and the first and second vertical conductive lines in the columns of cells, where each of the bottom select lines in current-flow contact with a column of vertical semiconductor bodies.

A plurality of stacks of conductive strips is disposed adjacent vertical semiconductor bodies in the columns above the pillar select lines. Charge storage structures are disposed on sidewalls of conductive strips in the stacks of conductive strips, where the columns of cells are disposed at crosspoints of the conductive strips in the stacks and the pillars.

Conductive strips in the stacks are separated by trenches. The pillar select lines are coupled to the vertical semiconductor bodies in respective rows of pillars arranged across multiple trenches. The bottom select lines are coupled to the vertical semiconductor bodies of pillars arranged along respective trenches. The bottom select lines can extend in a first direction, and the pillar select lines can extend in a second direction orthogonal to the first direction.

The device can include first horizontal conductive lines overlying the stacks and coupled to the first vertical conductive lines of pillars arranged along respective trenches, and second horizontal conductive lines overlying the stacks and coupled to the second vertical conductive lines in respective rows of pillars arranged across multiple trenches. The first horizontal conductive lines can extend in a first direction, and the second horizontal conductive lines can extend in a second direction orthogonal to the first direction.

In one embodiment, a plurality of input lines 2365 can be connected to the first vertical conductive lines in a column of cells, and a plurality of output lines 2355 can be connected to the second vertical conductive lines in the column of cells. In an alternative embodiment, a plurality of input lines 2365 can be connected to the second vertical conductive lines in a column of cells, and a plurality of output lines 2355 can be connected to the first vertical conductive lines in the column of cells.

Decoders 2340 are coupled to word lines, pillar select lines and bottom select lines 2345. Decoders 2340 can apply word line voltages to the conductive strips in the stacks of conductive strips, pillar select line voltages to the pillar select lines, and bottom select line voltages to the bottom select lines in the 3D array 2360. Cells in columns of cells in the 3D array can be selected in response to signals on the word lines, pillar select lines and bottom select lines 2345 as terms in the sum-of-products operation.

An input driver 2370 is coupled to the plurality of input lines 2365. A sensing circuit 2350 is coupled to the plurality of output lines 2355 to sense a sum-of-currents in a set of output lines in the plurality of output lines, and is in turn coupled to the buffer circuits 2390 via a bus 2353 to store sensing results in the buffer circuits 2390. The sum-of-currents can correspond to a sum-of-products.

Addresses are supplied on bus 2330 from control logic (controller) 2310 to an input driver 2370 and a gate driver 2340. Voltage sensing sense amplifiers in circuits 2380 are coupled to the input driver 2370 via lines 2375, and are in turn coupled to buffer circuits 2390. Buffer circuits 2390 can be coupled with the sense amplifiers in circuits 2380 via a bus 2385 to store program data for programming of the transistors in the cells in the array. Buffer circuits 2390 can be coupled with the input/output circuits 2391 via a bus 2393. Also, the control logic 2310 can include circuits for selectively applying program voltages to the transistors in the cells in the array in response to the program data values in the buffer circuits 2390.

Input/output circuits 2391 drive the data to destinations external to the integrated circuit device 2300. Input/output data and control signals are moved via data bus 2305 between the input/output circuits 2391, the control logic 2310 and input/output ports on the integrated circuit device 2300 or other data sources internal or external to the integrated circuit device 2300, such as a general purpose processor or special purpose application circuitry, or a combination of modules providing system-on-a-chip functionality supported by the array of cells 2360.

The control logic 2310 is coupled to the buffer circuits 2390 and the array of cells 2360, and to other peripheral circuits used in memory access and in memory sum-of-products operations.

Control logic 2310, using a bias arrangement state machine, controls the application of supply voltages generated or provided through the voltage supply or supplies in block 2320, for memory operations in some embodiments. In other embodiments, control logic 2310, using a bias arrangement state machine, controls the application of supply voltages generated or provided through the voltage supply or supplies in block 2320, for sum-of-products operations.

The control logic 2310 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

Figure 24:
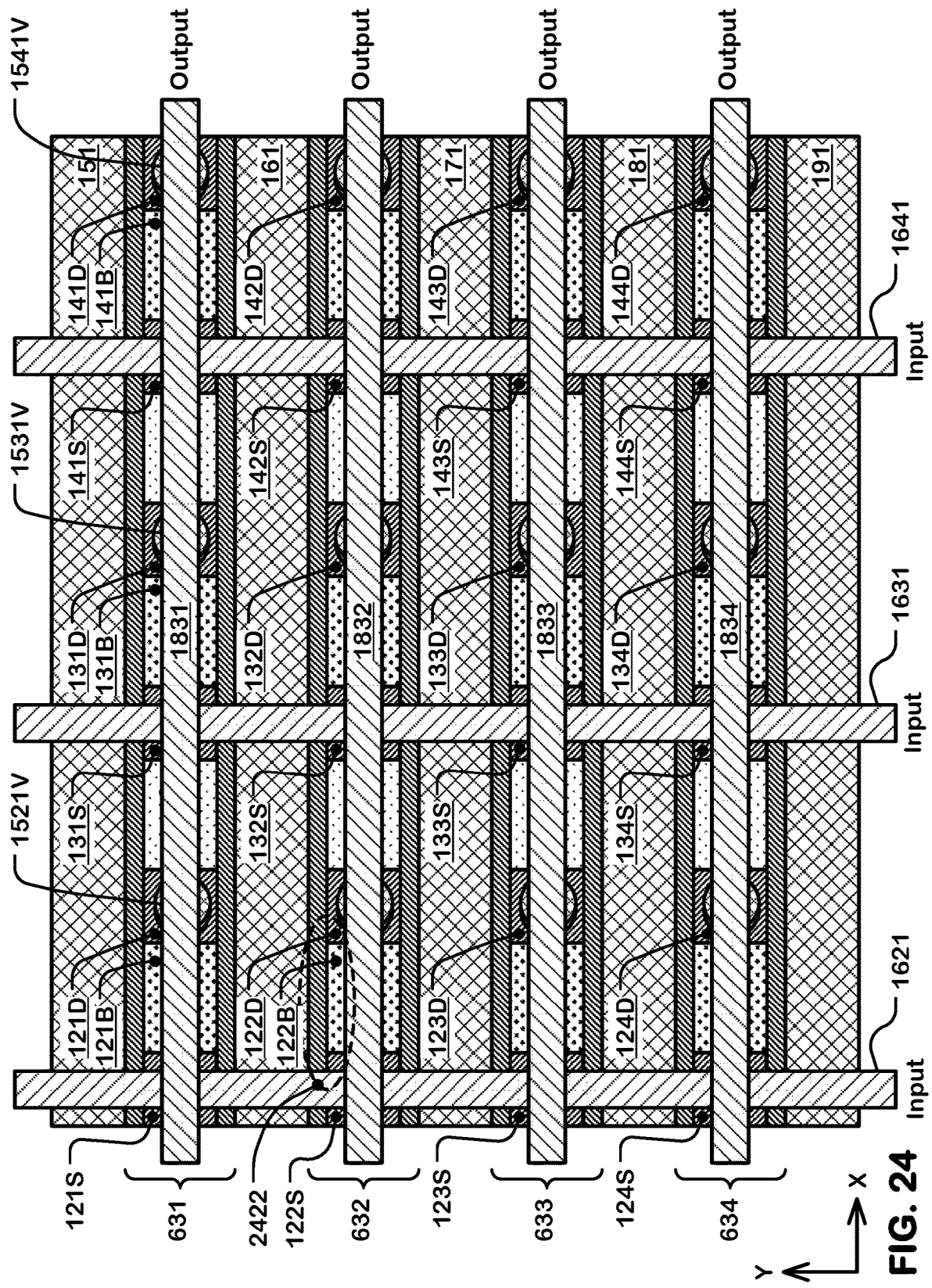
FIGS. 24-26 illustrate example operations on the device as described herein in embodiments.
Figure 25:
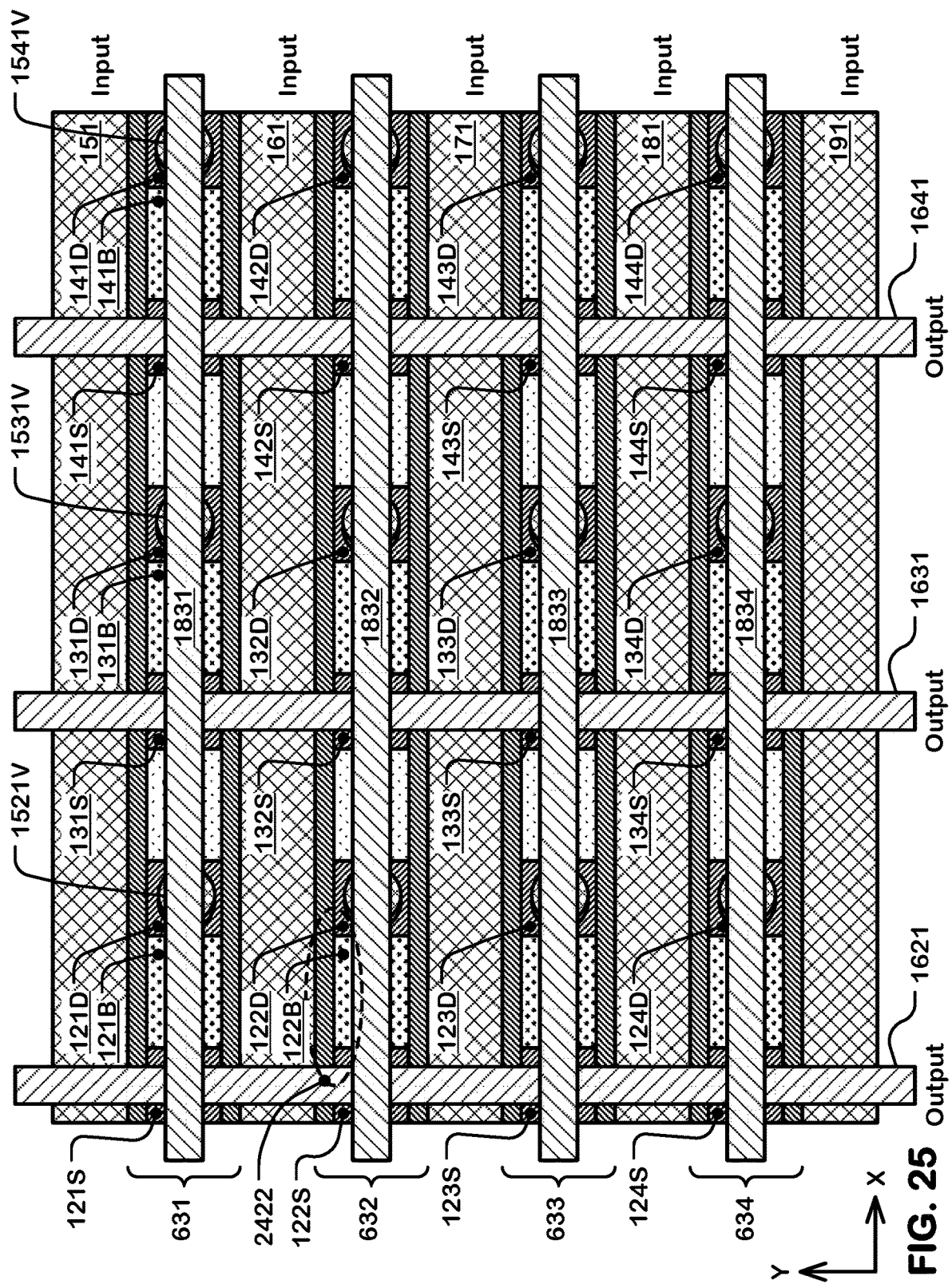
Figure 26:
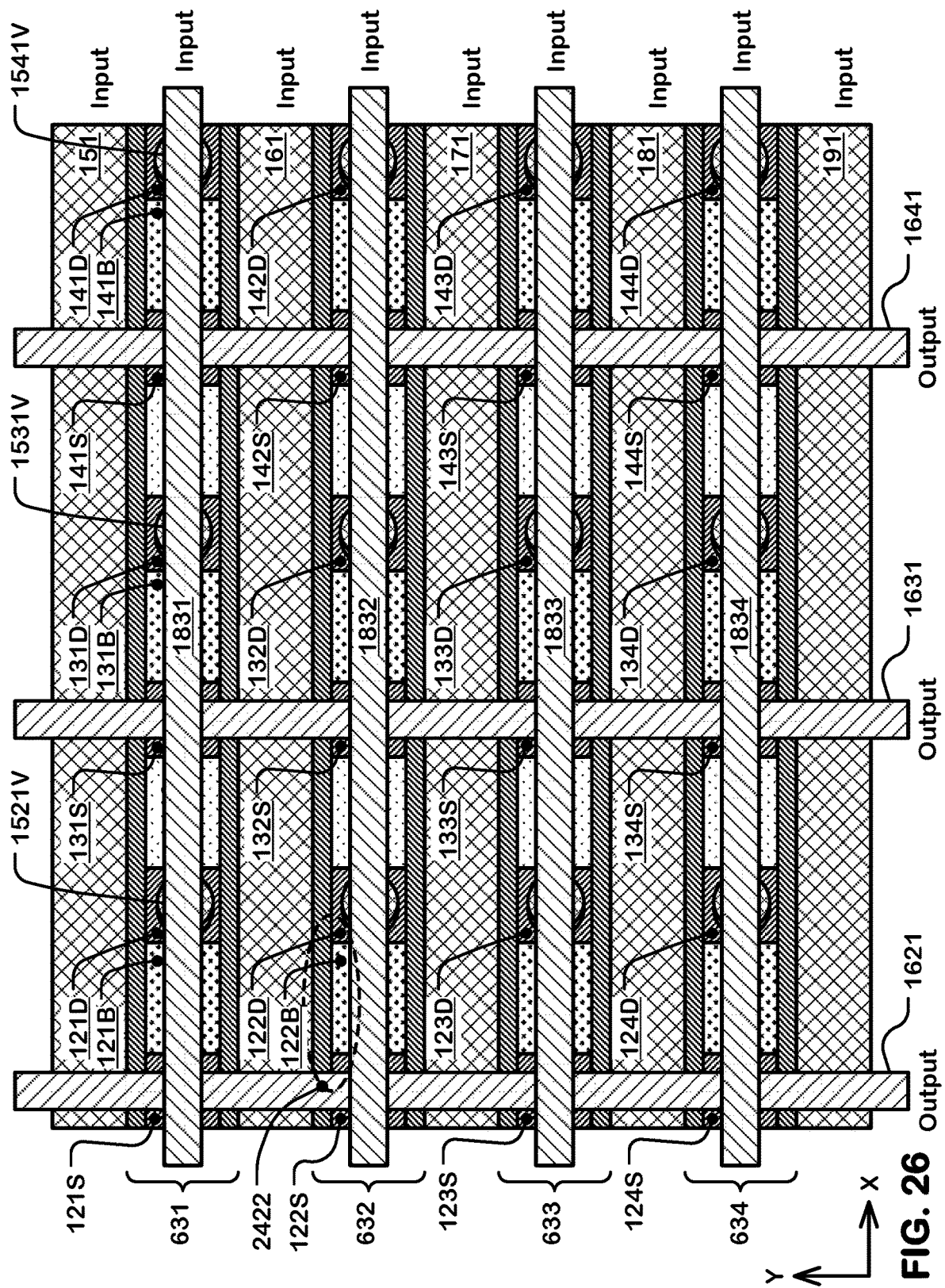

FIGS. 24-26 illustrate example operations on the device as described herein in embodiments. Description of the device in reference to at least FIGS. 15-18 is applicable to FIGS. 24-26. As shown in the examples of FIGS. 24-26, a particular cell 2422 is disposed in a column of cells that includes a pillar comprising a first vertical conductive line (122S), a second vertical conductive line (122D), and a vertical semiconductor body (122B) disposed between and in contact with the first and second vertical conductive lines. To program/erase the particular cell using the +/−FN (Fowler-Nordheim) program/erase operations, a bias voltage can be applied between a vertical semiconductor body (122B) and a conductive strip (161) in a stack of conductive strips disposed adjacent the vertical semiconductor body. To read a particular cell, one of common source and common drain of cells in a column of cells can act as input and another of the common source and common drain can act as output.

FIG. 24 illustrates example operations on the device as described herein in a first embodiment. In the first embodiment, the first horizontal conductive lines (1831, 1832, 1833, 1834) can act as output lines, and the second horizontal conductive lines (1621, 1631, 1641) can act as input lines. A conductive strip 161 in a stack of conductive strips can act as a gate line for the particular cell 2422. A second horizontal conductive line 1621 can act as an input line for the particular cell 2422. A first horizontal conductive line 1832 can act as an output line for the particular cell 2422.

Example bias conditions for the first embodiment of operations are listed in TABLEs 1A, 1B and 1C for Program, Erase and Read, respectively.

TABLE 1A

| Program | |
| --- | --- |
| Gate line (161) for the particular cell | 20 V |
| Conductive strips under the gate line for the particular cell | 10 V |
| Input line (1621) coupled to the particular cell | floating |
| Input lines near the input line coupled to the particular cell | 10 V |
| Output line (1832) coupled to the particular cell | floating |
| Output lines near the gate line coupled to the particular cell | 10 V |
| Bottom select line coupled to the particular cell | 0 V |
| Pillar select line coupled to the particular cell | 8 V |
| Other conductive strips in the stacks, other input lines, other output lines, other bottom select lines | 0 V |

TABLE 1B

| Erase | |
| --- | --- |
| Gate line (161) for the particular cell | 0 V |
| Conductive strips under the gate line for the particular cell | 10 V |
| Input line (1621) coupled to the particular cell | floating |
| Input lines near the input line coupled to the particular cell | 10V |
| Output line (1832) coupled to the particular cell | floating |
| Output lines near the gate line coupled to the particular cell | 10 V |
| Bottom select line coupled to the particular cell | 20 V |
| Pillar select line coupled to the particular cell | 8 V |
| Other conductive strips in the stacks, other input lines, other output lines, other bottom select lines | 0 V |

TABLE 1C

| Read | |
| --- | --- |
| Gate line for the particular cell | 3 V |
| Input line (e.g. BL) coupled to the particular cell (An artificial neuron network ANN can include different layers to perform different kinds of transformations on their inputs. The output of the last layer in an artificial neuron network ANN can provide input to the input line of this layer in the ANN.) | Output V from last layer of the ANN |
| Output line coupled to the particular cell | 0 V |
| Bottom select line coupled to the particular cell | 0 V |
| Other bottom select lines | 0 V |

FIG. 25 illustrates example operations on the device as described herein in a second embodiment. In the second embodiment, the conductive strips in the stacks (151, 161, 171, 181, 191) can act as input lines, and the second horizontal conductive lines (1621, 1631, 1641) can act as output lines. A conductive strip 161 in a stack of conductive strips can act as an input line for the particular cell 2422. A second horizontal conductive line 1621 can act as an output line for the particular cell 2422.

Example bias conditions for the second embodiment of operations are listed in TABLEs 2A, 2B and 2C for Program, Erase and Read, respectively.

TABLE 2A

| Program | |
| --- | --- |
| Input line (161) for the particular cell | 20 V |
| Conductive strips under the input line for the particular cell | 10 V |
| Output line (1621) coupled to the particular cell | floating |
| Output lines near the output line coupled to the particular cell | 10 V |
| First horizontal conductive line (1832) coupled to the particular cell | floating |
| First horizontal conductive lines near the input line coupled to the particular cell | 10 V |
| Bottom select line coupled to the particular cell | 0 V |
| Pillar select line coupled to the particular cell | 5 V |
| Other conductive strips in the stacks, other output lines, other first horizontal conductive lines, other bottom select lines | 0 V |

TABLE 2B

| Erase | |
| --- | --- |
| Input line (161) for the particular cell | 0 V |
| Conductive strips under the input line for the particular cell | 10 V |
| Output line (1621) coupled to the particular cell | floating |
| Output lines near the output line coupled to the particular cell | 10 V |
| First horizontal conductive line (1832) coupled to the particular cell | floating |
| First horizontal conductive lines near the input line coupled to the particular cell | 10 V |
| Bottom select line coupled to the particular cell | 20 V |
| Pillar select line coupled to the particular cell | 5 V |
| Other conductive strips in the stacks, other output lines, other first horizontal conductive lines, other bottom select lines | 0 V |

TABLE 2C

| Read | |
|---|---|
| Input line (161) for the particular cell | 3 V |
| Output line coupled to the particular cell | 0 V |
| First horizontal conductive line (1832) coupled to the particular cell | Output V from last layer of the ANN |
| Bottom select line coupled to the particular cell | 0 V |
| Other bottom select lines | 0 V |

FIG. 26 illustrates example operations on the device as described herein in a third embodiment. In the third embodiment, the conductive strips in the stacks (151, 161, 171, 181, 191) and the first horizontal conductive lines (1831, 1832, 1833, 1834) can act as input lines, and the second horizontal conductive lines (1621, 1631, 1641) can act as output lines. A conductive strip 161 in a stack of conductive strips can act as an input line for the particular cell 2422. A second horizontal conductive line 1621 can act as an output line for the particular cell 2422.

Example bias conditions for the third embodiment of operations are listed in TABLEs 3A, 3B and 3C for Program, Erase and Read, respectively.

TABLE 3A

| Program | |
|---|---|
| Input line (161) for the particular cell | 20 V |
| Conductive strips under the input line for the particular cell | 10 V |
| Output line (1621) coupled to the particular cell | floating |
| Output lines near the output line coupled to the particular cell | 10 V |
| First horizontal conductive line (1832) coupled to the particular cell | floating |
| First horizontal conductive lines near the input line coupled to the particular cell | 10 V |
| Bottom select line coupled to the particular cell | 0 V |
| Pillar select line coupled to the particular cell | 5 V |
| Other conductive strips in the stacks, other output lines, other first horizontal conductive lines, other bottom select lines | 0 V |

TABLE 3B

| Erase | |
|---|---|
| Input line (161) for the particular cell | 0 V |
| Conductive strips under the input line for the particular cell | 10 V |
| Output line (1621) coupled to the particular cell | floating |
| Output lines near the output line coupled to the particular cell | 10 V |
| First horizontal conductive line (1832) coupled to the particular cell | floating |
| First horizontal conductive lines near the input line coupled to the particular cell | 10 V |
| Bottom select line coupled to the particular cell | 20 V |
| Pillar select line coupled to the particular cell | 5 V |
| Other conductive strips in the stacks, other output lines, other first horizontal conductive lines, other bottom select lines | 0 V |

TABLE 3C

| Read | |
|---|---|
| Input line (161) for the particular cell | Output V from last layer of the ANN |
| Output line coupled to the particular cell | 0 V |
| First horizontal conductive line (1832) coupled to the particular cell | Output V from last layer of the ANN |
| Bottom select line coupled to the particular cell | 0 V |
| Other bottom select lines | 0 V |

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims. What is claimed is:

The invention claimed is:

1. A device, comprising:
a column of cells disposed in multiple levels of word lines including a pillar comprising a first vertical conductive line, a second vertical conductive line, and a vertical semiconductor body disposed between and in contact with the first and second vertical conductive lines;
a pillar select line adjacent to a gate dielectric and separated from the vertical semiconductor body by the gate dielectric to form a pillar select switch, the pillar select line disposed beneath the first and second vertical conductive lines; and
a bottom select line disposed beneath the first and second vertical conductive lines and insulated from the pillar select line and the first and second vertical conductive lines, the bottom select line in current-flow contact with the vertical semiconductor body of the pillar.

2. The device of claim 1, comprising:
a stack of conductive strips disposed adjacent the vertical semiconductor body above the pillar select line; and
charge storage structures on sidewalls of conductive strips in the stack of conductive strips,
wherein cells in the column of cells are disposed at cross-points of the conductive strips with the pillar, having source and drain terminals in the first and second vertical conductive lines, and channels in the vertical semiconductor body.

3. The device of claim 1, wherein the bottom select line extends in a first direction, and the pillar select line extends in a second direction orthogonal to the first direction.

4. The device of claim 1, comprising:
a first horizontal conductive line overlying the column of cells and coupled to the first vertical conductive line of the pillar; and
a second horizontal conductive line overlying the column of cells and coupled to the second vertical conductive line of the pillar,
wherein the first horizontal conductive line extends in a first direction, and the second horizontal conductive line extends in a second direction orthogonal to the first direction.

5. The device of claim 4, wherein the first and second horizontal conductive lines are input lines and output lines, respectively.

6. The device of claim 4, wherein the first and second horizontal conductive lines are output lines and input lines, respectively.

7. The device of claim 1, comprising:
a bias circuit operatively coupled to the bottom select line to apply bias voltages to the vertical semiconductor body for at least one of program and erase operations for the column of cells.

* * * * *